(12) United States Patent
Kimura et al.

(10) Patent No.: US 11,647,676 B2
(45) Date of Patent: May 9, 2023

(54) PIEZOELECTRIC THIN FILM DEVICE

(71) Applicant: TDK Corporation, Tokyo (JP)

(72) Inventors: Junichi Kimura, Tokyo (JP); Yukari Inoue, Tokyo (JP)

(73) Assignee: TDK Corporation, Tokyo (JP)

( * ) Notice: Subject to any disclaimer, the term of this patent is extended or adjusted under 35 U.S.C. 154(b) by 347 days.

(21) Appl. No.: 17/081,035

(22) Filed: Oct. 27, 2020

(65) Prior Publication Data

US 2021/0126185 A1 Apr. 29, 2021

(30) Foreign Application Priority Data

Oct. 29, 2019 (JP) .............................. JP2019-196629

(51) Int. Cl.
*H01L 41/187* (2006.01)
*H01L 41/047* (2006.01)
(Continued)

(52) U.S. Cl.
CPC .......... *H01L 41/187* (2013.01); *C01B 21/072* (2013.01); *C01B 21/076* (2013.01);
(Continued)

(58) Field of Classification Search
CPC ... H01L 41/187; H01L 41/047; C01B 21/072; C01B 21/076; C01P 2004/30; C01P 2004/38
See application file for complete search history.

(56) References Cited

U.S. PATENT DOCUMENTS 5,482,905 A * 1/1996 Nakahata .............. C04B 35/581
501/98.4
2004/0099918 A1 5/2004 Noguchi et al.
(Continued)

FOREIGN PATENT DOCUMENTS

JP 2004-095843 A 3/2004
JP 2004146640 A * 5/2004
(Continued)

*Primary Examiner* — J. San Martin
(74) *Attorney, Agent, or Firm* — Faegre Drinker Biddle & Reath LLP

(57) ABSTRACT

Provided is a piezoelectric thin film device containing: a first electrode layer; and a piezoelectric thin film. The first electrode layer contains a metal Me having a crystal structure. The piezoelectric thin film contains aluminum nitride having a wurtzite structure. The aluminum nitride contains a divalent metal element Md and a tetravalent metal element Mt. [Al] is an amount of Al contained in the aluminum nitride, [Md] is an amount of Md contained in the aluminum nitride, [Mt] is an amount of Mt contained in the aluminum nitride, ([Md]+[Mt])/([Al]+[Md]+[Mt]) is 36 to 70 atom %. $L_{ALN}$ is a lattice length of the aluminum nitride in a direction that is approximately parallel to a surface of the first electrode layer with which the piezoelectric thin film is in contact, $L_{METAL}$ is a lattice length of Me in a direction, and $L_{ALN}$ is longer than $L_{METAL}$.

9 Claims, 11 Drawing Sheets

(51) Int. Cl.
*C01B 21/072* (2006.01)
*C01B 21/076* (2006.01)

(52) U.S. Cl.
CPC ........ *H01L 41/047* (2013.01); *C01P 2002/70* (2013.01); *C01P 2004/30* (2013.01); *C01P 2004/38* (2013.01)

(56) References Cited

U.S. PATENT DOCUMENTS

| | | | | |
|---|---|---|---|---|
| 2014/0167560 | A1* | 6/2014 | Onda | H03H 9/175 |
| | | | | 310/311 |
| 2017/0294894 | A1 | 10/2017 | Aida et al. | |
| 2018/0041189 | A1 | 2/2018 | Lee et al. | |
| 2020/0154214 | A1* | 5/2020 | Jang | H04R 17/005 |
| 2020/0176667 | A1* | 6/2020 | Kimura | H01L 41/316 |

FOREIGN PATENT DOCUMENTS

| | | |
|---|---|---|
| JP | 2019-169612 A | 10/2019 |
| WO | WO-2016/111280 A1 | 7/2016 |
| WO | WO 2019/010173 A1 | 1/2019 |

* cited by examiner

PIEZOELECTRIC THIN FILM DEVICE

TECHNICAL FIELD

The present invention relates to a piezoelectric thin film device.

BACKGROUND

In recent years, micro electromechanical systems (MEMS) have attracted attention. The MEMS is a device in which mechanical element parts, electronic circuits, and the like are integrated on one substrate by a micro processing technology. In the MEMS having a function such as a sensor, a filter, a harvester, or an actuator, a piezoelectric thin film is used. In manufacturing of the MEMS using the piezoelectric thin film, a lower electrode layer, a piezoelectric thin film, and an upper electrode layer are stacked on a substrate such as silicon or sapphire. An MEMS having arbitrary characteristics is obtained after undergoing a post process such as a subsequent micro processing, subsequent patterning, or subsequent etching. When a piezoelectric thin film excellent in a piezoelectric property is selected, characteristics of the piezoelectric thin film device such as the MEMS are improved, and downsizing of the piezoelectric thin film device is possible. The piezoelectric property of the piezoelectric thin film is evaluated, for example, on the basis of a positive piezoelectric constant (piezoelectric strain constant) d, and a piezoelectric output coefficient g. g is equal to $d/\varepsilon_0\varepsilon_r$. $\varepsilon_0$ is a dielectric constant of vacuum, and $\varepsilon_r$ is a specific dielectric constant of the piezoelectric thin film. The characteristics of the piezoelectric thin film device are improved in accordance with an increase in d and g.

As a piezoelectric composition that constitutes the piezoelectric thin film, for example, lead zirconate titanate (Pb(Zr,Ti)$O_3$, abbreviated as PZT), lithium niobate (LiNb$O_3$), aluminum nitride (AlN), zinc oxide (ZnO), cadmium sulfide (CdS), and the like are known.

PZT and LiNb$O_3$ have a perovskite structure. d of the piezoelectric thin film having the perovskite structure is relatively large. However, in a case where the piezoelectric thin film has the perovskite structure, d is likely to decrease in accordance with a decrease in thickness of the piezoelectric thin film. Accordingly, the piezoelectric thin film having the perovskite structure is not suitable for micro processing. In addition, since $\varepsilon_r$ of the piezoelectric thin film having the perovskite structure is relatively large, there is a tendency that g of the piezoelectric thin film having the perovskite structure is relatively small.

On the other hand, AlN, ZnO, and CdS have a wurtzite structure. d of the piezoelectric thin film having the wurtzite structure is smaller than d of the piezoelectric thin film having the perovskite structure. However, since $\varepsilon_r$ of the piezoelectric thin film having the wurtzite structure is relatively small, the piezoelectric thin film having the wurtzite structure can have larger g in comparison to the piezoelectric thin film having the perovskite structure. Therefore, a piezoelectric composition having a wurtzite structure is a promising material for a piezoelectric thin film device for which large g is required. (Refer to Pamphlet of International Publication WO 2016/111280)

SUMMARY

In a case where the piezoelectric thin film containing AlN is formed on a surface of an electrode layer consisting of a metal, a tensile stress that is approximately parallel to the surface of the electrode layer is likely to occur in the piezoelectric thin film. Spontaneous breakage of the piezoelectric thin film is likely to occur due to the tensile stress. For example, cracks are likely to be formed in the piezoelectric thin film along a direction that is approximately orthogonal to the surface of the electrode layer due to the tensile stress. In addition, the piezoelectric thin film is likely to be peeled off from the electrode layer due to the tensile stress. Due to the breakage of the piezoelectric thin film, a piezoelectric property and an insulation property of the piezoelectric thin film deteriorate, and a yield rate of the piezoelectric thin film device decreases.

An object of the invention is to provide a piezoelectric thin film device in which breakage of the piezoelectric thin film is suppressed.

According to an aspect of the invention, there is provided piezoelectric thin film device containing: a first electrode layer; and a piezoelectric thin film that directly overlaps the first electrode layer. The first electrode layer contains a metal Me having a crystal structure. The piezoelectric thin film contains aluminum nitride having a wurtzite structure. The aluminum nitride contains a divalent metal element Md and a tetravalent metal element Mt. [Al] is an amount of aluminum contained in the aluminum nitride, [Md] is a total amount of the metal element Md contained in the aluminum nitride, [Mt] is a total amount of the metal element Mt contained in the aluminum nitride, and ([Md]+[Mt])/([Al]+[Md]+[Mt]) is from 36 atom % to 70 atom %. $L_{ALN}$ is a lattice length of the aluminum nitride in a direction that is approximately parallel to a surface of the first electrode layer with which the piezoelectric thin film is in contact, $L_{METAL}$ is a lattice length of the metal Me in a direction that is approximately parallel to the surface of the first electrode layer with which the piezoelectric thin film is in contact, and $L_{ALN}$ is longer than $L_{METAL}$.

The crystal structure of the metal Me may be a face-centered cubic structure (fcc structure), a body-centered cubic structure (bcc structure), or a hexagonal close-packed structure (hcp structure).

A (001) plane of the wurtzite structure may be approximately parallel to the surface of the first electrode layer with which the piezoelectric thin film is in contact, the crystal structure of the metal Me may be a face-centered cubic structure, a (111) plane of the face-centered cubic structure may be approximately parallel to the surface of the first electrode layer with which the piezoelectric thin film is in contact, $a_W$ is a minimum interval of elements in the (001) plane of the wurtzite structure, $a_F$ is a lattice constant of the face-centered cubic structure, the $L_{ALN}$ may be expressed by $3^{1/2} \times a_W$, and the $L_{METAL}$ may be expressed by $2^{1/2} \times a_F$.

A (001) plane of the wurtzite structure may be approximately parallel to the surface of the first electrode layer with which the piezoelectric thin film is in contact, the crystal structure of the metal Me may be a body-centered cubic structure, a (110) plane of the body-centered cubic structure may be approximately parallel to the surface of the first electrode layer with which the piezoelectric thin film is in contact, $a_W$ is a minimum interval of elements in the (001) plane of the wurtzite structure, $a_B$ is a lattice constant of the body-centered cubic structure, the $L_{ALN}$ may be expressed by $7^{1/2} \times a_W$, and the $L_{METAL}$ may be expressed by $2 \times 2^{1/2} \times a_B$. Or the $L_{ALN}$ may be expressed by $3^{1/2} \times a_W$, and the $L_{METAL}$ may be expressed by $2 \times a_B$.

A (001) plane of the wurtzite structure may be approximately parallel to the surface of the first electrode layer with which the piezoelectric thin film is in contact, the crystal structure of the metal Me may be a hexagonal close-packed structure, a (001) plane of the hexagonal close-packed structure may be approximately parallel to the surface of the first electrode layer with which the piezoelectric thin film is in contact, $a_W$ is a minimum interval of elements in the (001) plane of the wurtzite structure, $a_H$ is a minimum interval of the metal Me (elements Me) in the (001) plane of the hexagonal close-packed structure, the $L_{ALN}$ may be equal to $a_W$, and the $L_{METAL}$ may be equal to $a_H$. Or the $L_{ALN}$ may be expressed by $3^{1/2} \times a_W$, and the $L_{METAL}$ may be expressed by $2 \times a_H$.

The aluminum nitride may contain at least magnesium as the metal element Md, and the aluminum nitride may contain at least one kind of element selected from the group consisting of zirconium, hafnium, and titanium as the metal element Mt.

The degree of lattice mismatching ΔL may be defined as $(L_{ALN}-L_{METAL})/L_{METAL}$, and the degree of lattice mismatching ΔL may be greater than 0% and equal to or less than 8%.

A compressive stress may occur in the piezoelectric thin film, the compressive stress may be approximately parallel to the surface of the first electrode layer with which the piezoelectric thin film is in contact, and the compressive stress may be greater than 0 MPa and equal to or less than 1500 MPa.

The piezoelectric thin film device may further contain a second electrode layer that overlaps the piezoelectric thin film, and the piezoelectric thin film may be located between the first electrode layer and the second electrode layer.

According to the invention, a piezoelectric thin film device in which breakage of a piezoelectric thin film is suppressed is provided.

DETAILED DESCRIPTION

Figure 1:
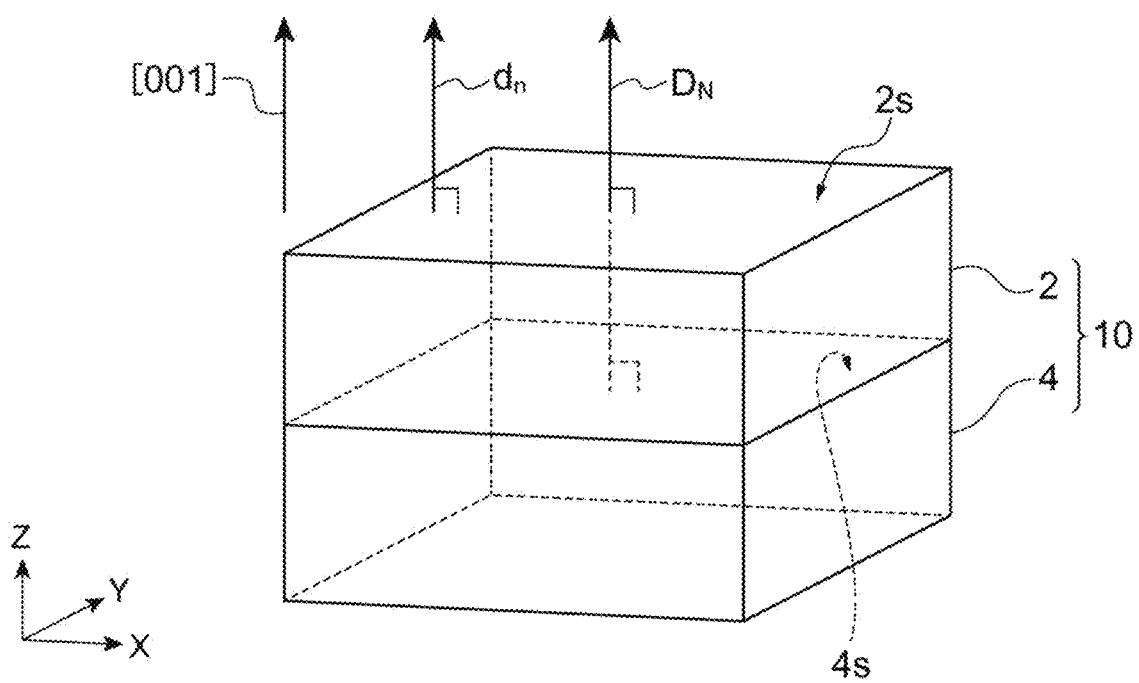
FIG. 1 is a schematic perspective view of a piezoelectric thin film device according to an embodiment of the invention.

Hereinafter, a preferred embodiment of the invention will be described with reference to the accompanying figures. The invention is not limited the following embodiments at all. In each of the figures, the same reference numeral will be given to the same or equivalent constituent element. X, Y, and Z in each of the figures represent three coordinate axes orthogonal to each other.

Figure 11:
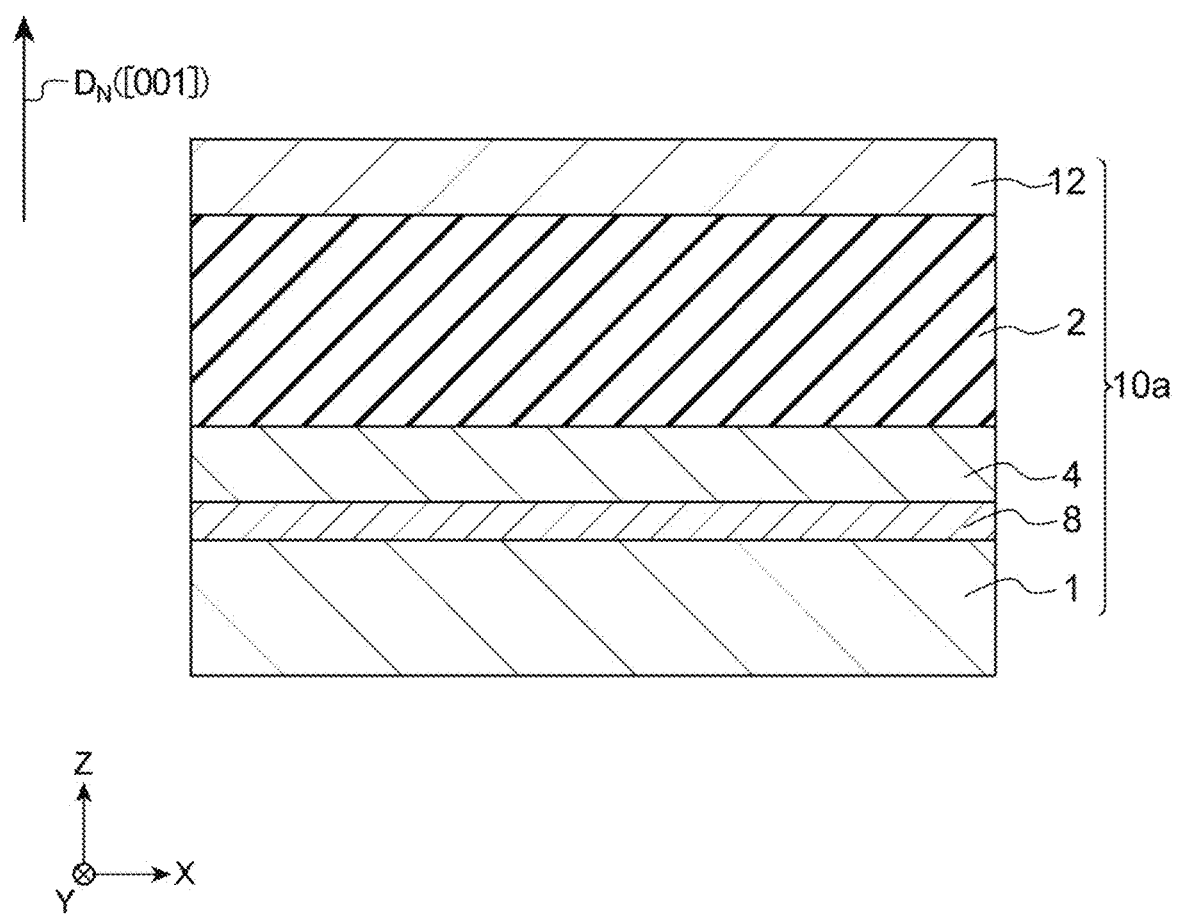
FIG. 11 illustrates a schematic cross-section of a piezoelectric thin film device according to another embodiment of the invention, and the cross-section is approximately orthogonal to a surface of a first electrode layer.

As illustrated in FIG. 1, a piezoelectric thin film device 10 according to this embodiment contains a first electrode layer 4, and a piezoelectric thin film 2 that directly overlaps a surface 4s of the first electrode layer 4. A surface 2s of the piezoelectric thin film 2 may be approximately parallel to the surface 4s of the first electrode layer 4 with which the piezoelectric thin film 2 is in contact. In other words, a normal direction $d_n$ of the surface 2s of the piezoelectric thin film 2 may be approximately parallel to a normal direction $D_N$ of the surface 4s of the first electrode layer 4. The normal direction $D_N$ may be referred to as a thickness direction of the first electrode layer 4 (Z-axis direction). The normal direction $d_n$ may be referred to as a thickness direction of the piezoelectric thin film 2 (Z-axis direction). The piezoelectric thin film 2 may cover a part or the entirety of the surface 4s of the first electrode layer 4. The piezoelectric thin film device 10 may further contain a second electrode layer that overlaps the piezoelectric thin film 2, and the piezoelectric thin film 2 may be located between the first electrode layer 4 and the second electrode layer. For example, as illustrated in FIG. 11, a piezoelectric thin film device 10a may contain a substrate 1, an adhesion layer 8 that directly overlaps the substrate 1, the first electrode layer 4 that directly overlaps the adhesion layer 8, the piezoelectric thin film 2 that directly overlaps the first electrode layer 4, and a second electrode layer 12 that directly overlaps the piezoelectric thin film 2. The first electrode layer 4 may be referred to as a lower electrode layer. The second electrode layer 12 may be referred to as an upper electrode layer. The piezoelectric thin film device 10a may not contain the second electrode layer 12. For example, after a piezoelectric thin film device that does not contain the second electrode layer is supplied to a manufacturer of an electronic device as a product, the second electrode layer may be applied to the piezoelectric thin film device in a process of manufacturing the electronic device.

Figure 2:
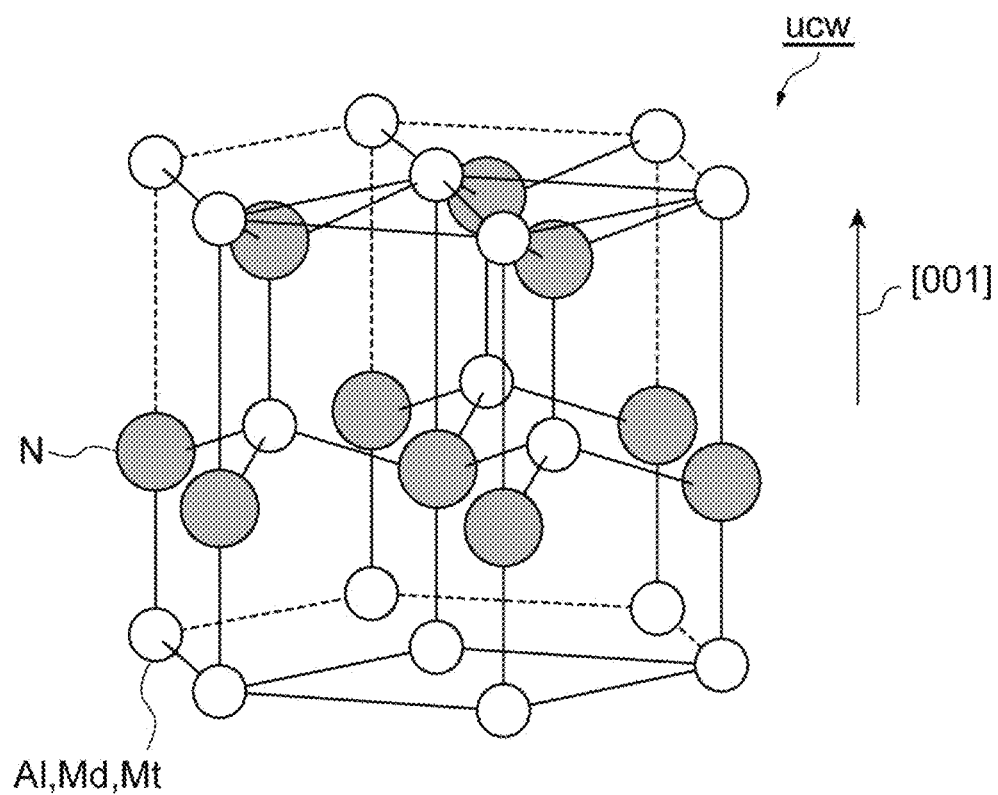
FIG. 2 is a perspective view of a unit cell of a wurtzite structure (aluminum nitride).
Figure 3:
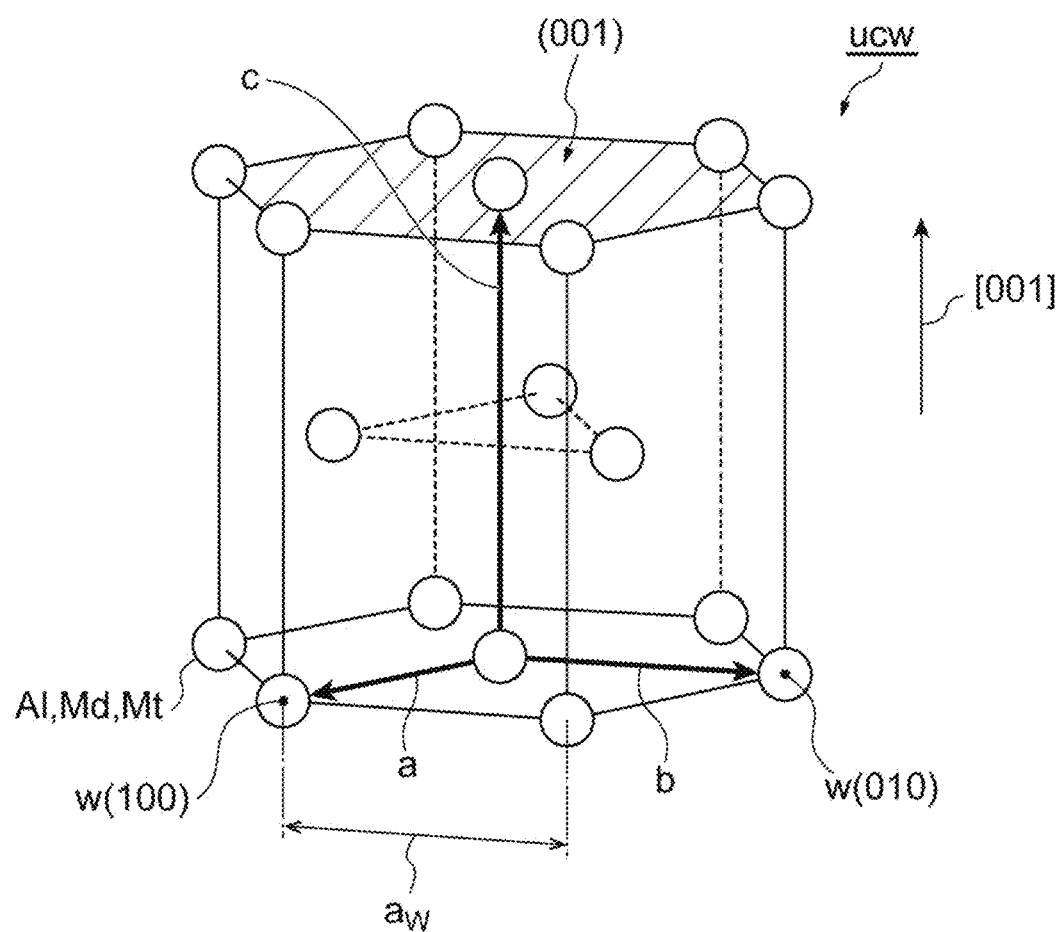
FIG. 3 is a view illustrating a basic vector of the wurtzite structure in FIG. 2.

The piezoelectric thin film 2 contains aluminum nitride (AlN). The AlN has a hexagonal wurtzite structure. FIG. 2 and FIG. 3 illustrate a unit cell ucw of the wurtzite structure. The unit cell ucw is a regular hexagonal prism. Each of a, b, and c in FIG. 3 is a basic vector of the wurtzite structure. In FIG. 3, nitrogen (N) is omitted to show a, b, and c. A crystal orientation indicated by a is [100]. A crystal orientation indicated by b is [010]. A crystal orientation indicated by c is [001]. a and b belong to the same crystal plane. An angle made by a and b is 120°. c is orthogonal to each of a and b. $a_W$ in FIG. 3 represents a minimum interval of elements in a (001) plane of the wurtzite structure. $a_W$ may be referred to as a minimum interval of aluminum (Al) located in the (001) plane of the wurtzite structure. $a_W$ may be referred to as a length of the basic vector a of the wurtzite structure. $a_W$ may be referred to as a lattice constant of the wurtzite structure in an a-axis direction. For example, $a_W$ may be from 0.311 nm to 0.392 nm. A length of the basic vector c of the wurtzite structure may be expressed by $c_W$. $c_W$ may be referred to as a lattice constant of the wurtzite structure in a c-axis direction. $c_W$ may be referred to as an interval of the (001) plane of the wurtzite structure. For example, $c_W$ may be from 0.498 nm to 0.549 nm. For example, $c_W/a_W$ may be from 1.40 to 1.60. An arbitrary position or direction in the unit cell ucw of the wurtzite structure may be expressed by a vector w(x y z) defined in the following Mathematical Formula w. For example, w(x y z) may represent a position of an element that constitutes the wurtzite structure.

$$w(x\ y\ z)=xa+yb+zc \quad \text{(Mathematical Formula w)}$$

Each of x, y, and z in Mathematical Formula w is an arbitrary real number. Each of a, b, and c in Mathematical Formula w is the basic vector described above.

The (001) plane of the wurtzite structure of the aluminum nitride may be approximately parallel to the surface 4s of the first electrode layer 4 with which the piezoelectric thin film 2 is in contact. In other words, the (001) plane of the wurtzite structure of the aluminum nitride may be oriented in the normal direction $D_N$ of the surface 4s of the first electrode layer 4. The (001) plane of the wurtzite structure corresponds to a crystal plane of a regular hexagonal shape in the unit cell ucw. In a case where the piezoelectric thin film 2 contains a plurality of AlN crystalline grains, a (001) plane of a part or the entirety of the crystalline grains may be approximately parallel to the surface 4s of the first electrode layer 4. In other words, the (001) plane of the part or the entirety of the crystalline grains may be oriented in the normal direction $D_N$ of the surface of the first electrode layer 4. For example, the AlN crystalline grains may be columnar crystals extending in the normal direction $D_N$ of the surface 4s of the first electrode layer 4.

A crystal orientation in which a piezoelectric property of the aluminum nitride is exhibited is [001] of the wurtzite structure. Accordingly, when the (001) plane of the wurtzite structure is approximately parallel to the surface 4s of the first electrode layer 4, the piezoelectric thin film 2 can have an excellent piezoelectric property. From the same reason, the (001) plane of the wurtzite structure of the aluminum nitride may be approximately parallel to the surface 2s of the piezoelectric thin film 2. In other words, the (001) plane of the wurtzite structure of the aluminum nitride may be oriented in the normal direction $d_n$ of the surface 2s of the piezoelectric thin film 2.

The AlN contains a divalent metal element Md and a tetravalent metal element Mt. In other words, a part of Al in the unit cell ucw of the wurtzite structure is substituted with the Md or Mt. The piezoelectric thin film 2 may consist of only AlN containing the Md and Mt. That is, the piezoelectric thin film 2 may consist of only Al, N, Md, and Mt.

When the AlN is doped with the Md and Mt, the wurtzite structure of the aluminum nitride may be distorted, or the strength of a chemical bond between atoms in the wurtzite structure may vary. From these reasons, the piezoelectric property of the piezoelectric thin film 2 is likely to be improved. In addition, when the AlN is doped with the Md and Mt, a volume of the unit cell ucw increases, and the lattice length $L_{ALN}$ of the aluminum nitride increases. Details of the $L_{ALN}$ will be described later.

The first electrode layer 4 contains a metal Me having a crystal structure. The first electrode layer 4 may consist of only the metal Me. The metal Me may be a simple substance of a metal. The metal Me may be an alloy. That is, the first electrode layer 4 may contain at least two kinds of metal elements as the metal Me. The crystal structure of the metal Me may be a face-centered cubic structure, a body-centered cubic structure, or a hexagonal close-packed structure.

The $L_{ALN}$ is a lattice length of the aluminum nitride in a direction that is approximately parallel to the surface 4s of the first electrode layer 4 with which the piezoelectric thin film 2 is in contact. $L_{METAL}$ is a lattice length of the metal Me in a direction that is approximately parallel to the surface 4s of the first electrode layer 4 with which the piezoelectric thin film 2 is in contact. $L_{ALN}$ is longer than $L_{METAL}$.

Figure 10A:
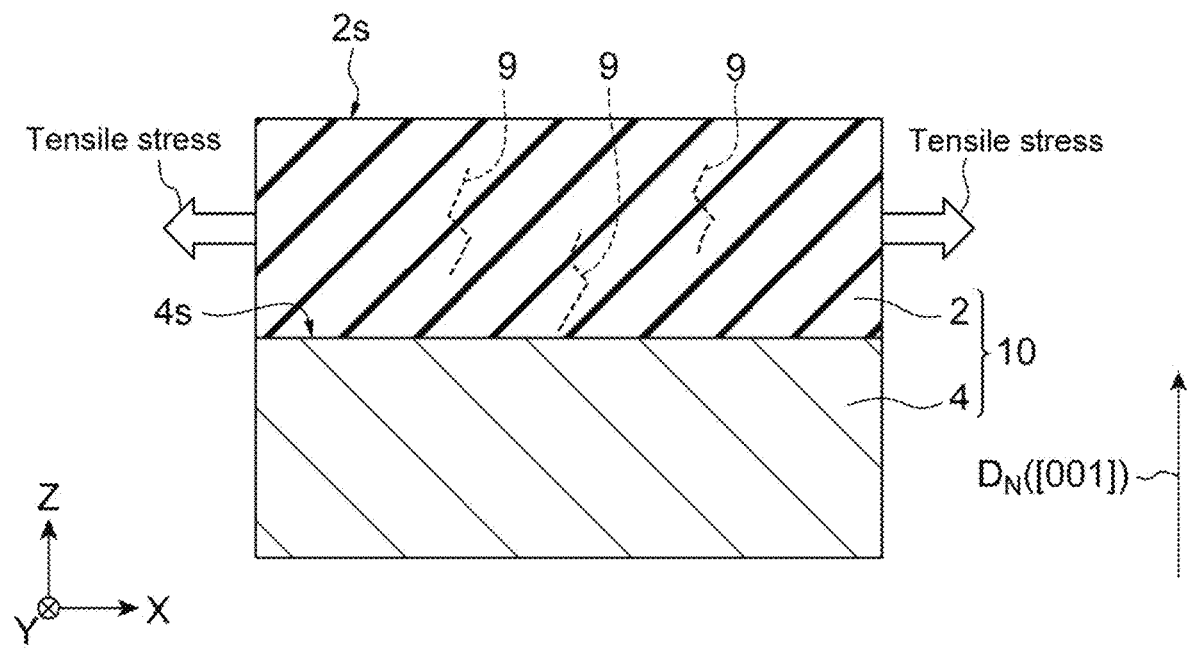
FIG. 10A illustrates a schematic cross-section of the piezoelectric thin film device in which a tensile stress occurs in the piezoelectric thin film, the cross-section being approximately orthogonal to a surface of a first electrode layer.
Figure 10B:
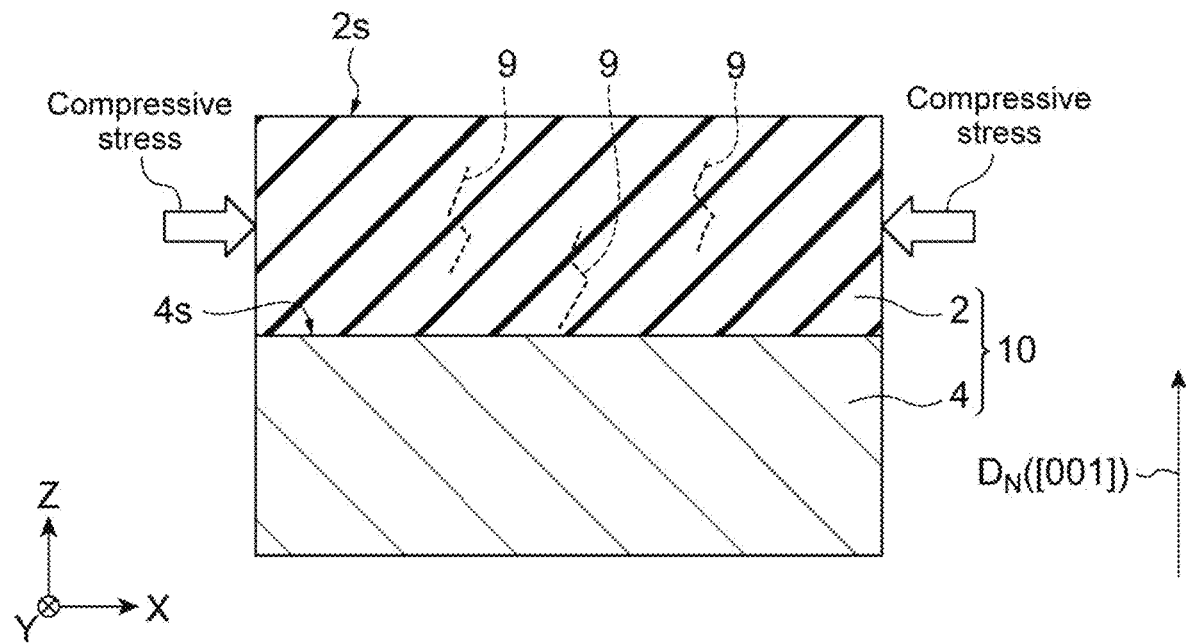
FIG. 10B illustrates a schematic cross-section of the piezoelectric thin film device in which a compressive stress occurs in the piezoelectric thin film, the cross-section being approximately orthogonal to the surface of the first electrode layer.

The wurtzite structure of the piezoelectric thin film 2 is influenced by the crystal structure of the first electrode layer 4 because the piezoelectric thin film 2 is partially epitaxially formed on the surface 4s of the first electrode layer 4. In addition, in a case where $L_{ALN}$ is shorter than $L_{METAL}$, a stress that causes the wurtzite structure to expand in in-plane direction occurs at an interface between the piezoelectric thin film 2 and the first electrode layer 4. As a result, as illustrated in FIG. 10A, a tensile stress that is approximately parallel to the surface 4s of the first electrode layer 4 occurs in the piezoelectric thin film 2. That is, the tensile stress is applied to the piezoelectric thin film 2 due to lattice mismatching between the piezoelectric thin film 2 and the first electrode layer 4. The piezoelectric thin film 2 is likely to be ruptured in a direction that is approximately parallel to the surface 4s of the first electrode layer 4 due to the tensile stress. For example, a crack 9 is likely to be formed in the piezoelectric thin film 2 along a direction that is approximately orthogonal to the surface 4s of the first electrode layer 4 due to the tensile stress. That is, spontaneous breakage of the piezoelectric thin film 2 is likely to occur due to the tensile stress. Due to the spontaneous breakage of the piezoelectric thin film 2, a piezoelectric property and an insulation property of the piezoelectric thin film 2 deteriorate, and a yield rate of the piezoelectric thin film device decreases. In contrast, in a case where $L_{ALN}$ is longer than $L_{METAL}$, a stress that causes the wurtzite structure to be contracted in the in-plane direction occurs at the interface between the piezoelectric thin film 2 and the first electrode layer 4. As a result, as illustrated in FIG. 10B, a compressive stress that is approximately parallel to the surface 4s of the first electrode layer 4 occurs in the piezoelectric thin film 2. That is, the compressive stress is applied to the piezoelectric thin film 2 due to lattice mismatching between the piezoelectric thin film 2 and the first electrode layer 4. Due to the compressive stress, the piezoelectric thin film 2 is less likely to be ruptured in a direction that is approximately parallel to the surface 4s of the first electrode layer 4. For example, due to the compressive stress, the crack 9 is less likely to be formed in the piezoelectric thin film 2 along a direction that is approximately orthogonal to the surface 4s of the first electrode layer 4. That is, spontaneous breakage of the piezoelectric thin film 2 is suppressed due to the compressive stress. The piezoelectric property and the insulation property of the piezoelectric thin film 2 are improved due to suppression of the breakage of the piezoelectric thin film 2, and the yield rate of the piezoelectric thin film device increases. From the same reasons, breakage of the piezoelectric thin film 2 in a manufacturing process (processing process) of the piezoelectric thin film device 10 according to this embodiment is also suppressed.

[Al] is an amount of Al contained in the aluminum nitride. [Md] is a total amount of Md contained in the aluminum nitride. [Mt] is a total amount of Mt contained in the aluminum nitride. A unit of each of [Al], [Md], and [Mt] is atom %. ([Md]+[Mt])/([Al]+[Md]+[Mt]) is from 36 atom % to 70 atom %. That is, 100×([Md]+[Mt])/([Al]+[Md]+[Mt]) is from 36 to 70.

The lattice constant $a_W$ and the lattice length $L_{ALN}$ of the wurtzite structure are controlled through adjustment of ([Md]+[Mt])/([Al]+[Md]+[Mt]). The lattice constant $a_W$ and the lattice length $L_{ALN}$ of the wurtzite structure may be controlled on the basis of the kind of Md and Mt. When ([Md]+[Mt])/([Al]+[Md]+[Mt]) is 36 atom % or greater, a volume of the unit cell ucw of the wurtzite structure sufficiently increases, and the lattice length $L_{ALN}$ of the aluminum nitride sufficiently increases. As a result, $L_{ALN}$ is likely to be controlled to a value longer than $L_{METAL}$. In a case where ([Md]+[Mt])/([Al]+[Md]+[Mt]) is greater than 70 atom %, the wurtzite structure is excessive distorted, and thus the wurtzite structure is likely to be damaged, and the piezoelectric property of the piezoelectric thin film 2 deteriorates. In a case where ([Md]+[Mt])/([Al]+[Md]+[Mt]) is in the above-described range, the wurtzite structure that is appropriately distorted is likely to be stabilized. From the reason, ([Md]+[Mt])/([Al]+[Md]+[Mt]) may be from 36 atom % to 65 atom %, or from 36 atom % to 60 atom %.

[Md]/[Mt] may be approximately 1.0. That is, [Md] may be approximately equal to [Mt]. In a case where [Md] is equal to [Mt], an average value of the valence of Md and Mt is trivalent, and is equal to the valence of Al. As a result, in the aluminum nitride, a total number of valence electrons of Al, Md, and Mt is likely to balance with a total number of valence electrons of N, and the wurtzite structure of the aluminum nitride is likely to be stabilized. However, [Md] may not equal to [Mt] as long as the wurtzite structure and the piezoelectric property of the aluminum nitride are not excessively damaged. In a case where [Md] is not equal to [Mt], the amount of each of Al, Md, Mt, and N contained in the aluminum nitride may be adjusted so that the total number of valence electrons of Al, Md, and Mt balances with the total number of balance electrons of N.

The aluminum nitride contained in the piezoelectric thin film 2 may be expressed by the following Chemical Formula A.

$$Al_{\{1-(\alpha+\beta)\}}Md_\alpha Mt_\beta N \qquad (A)$$

Each of α and β may be a positive real number, α+β may be from 0.36 to 0.70, and α/β may be approximately 1.0.

As to be described below, each of $L_{ALN}$ and $L_{METAL}$ may be defined in correspondence with the crystal structure of the metal Me.

Figure 4:
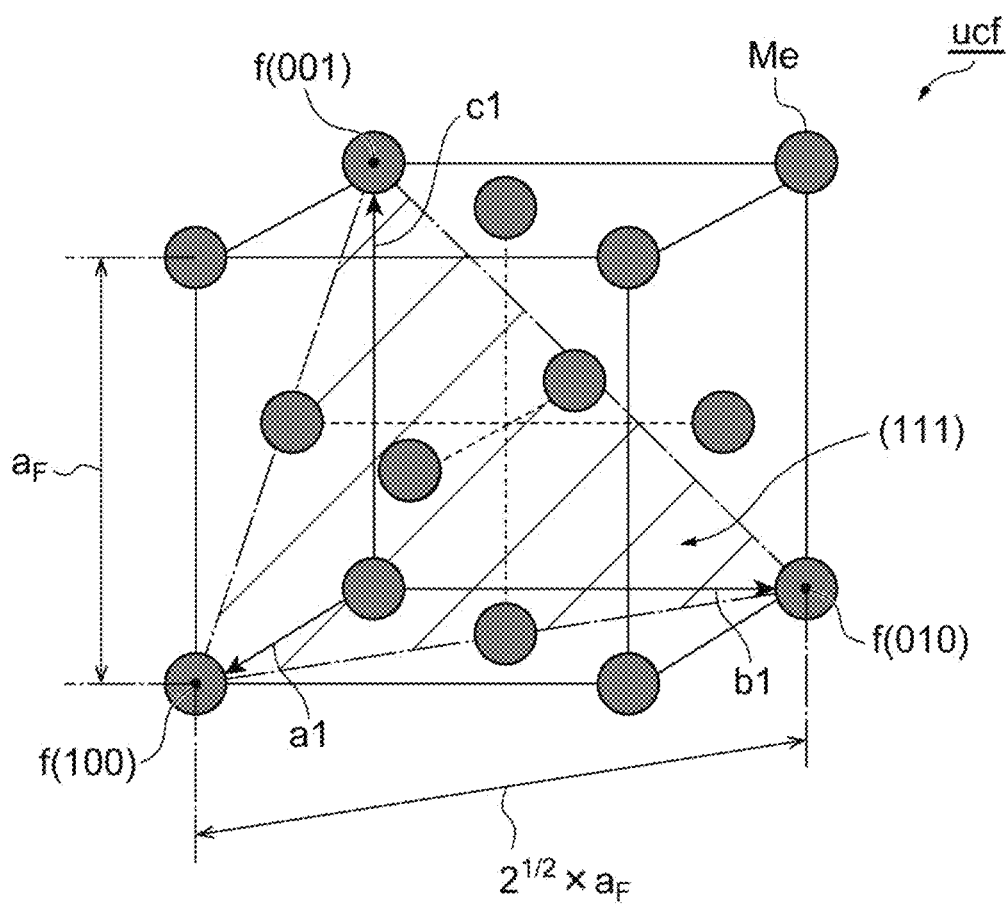
FIG. 4 is a perspective view of a unit cell of a face-centered cubic structure (metal Me).

The crystal structure of the metal Me may be a face-centered cubic structure (fcc structure). FIG. 4 illustrates a unit cell ucf of the fcc structure of the metal Me. The unit cell ucf is a cube. Each of a1, b1, and c1 in FIG. 4 is a basic vector of the fcc structure. A crystal orientation indicated by a1 is [100]. A crystal orientation indicated by b1 is [010]. A crystal orientation indicated by c1 is [001]. a1, b1, and c1 are orthogonal to each other. A length of each of a1, b1, and c1 is equal to a lattice constant $a_F$. That is, lengths of a1, b1, and c1 are equal to each other. An arbitrary position or direction in the unit cell ucf of the fcc structure may be expressed by a vector f(x y z) defined by the following Mathematical Formula f. For example, f(x y z) may represent a position of the metal element (Me) that constitutes the fcc structure.

$$f(x\ y\ z)=xa1+yb1+zc1 \qquad \text{(Mathematical Formula f)}$$

Each of x, y, and z in Mathematical Formula f is an arbitrary real number. Each of a1, b1, and c1 in Mathematical Formula f is the basic vector of the fcc structure.

Figure 5A:
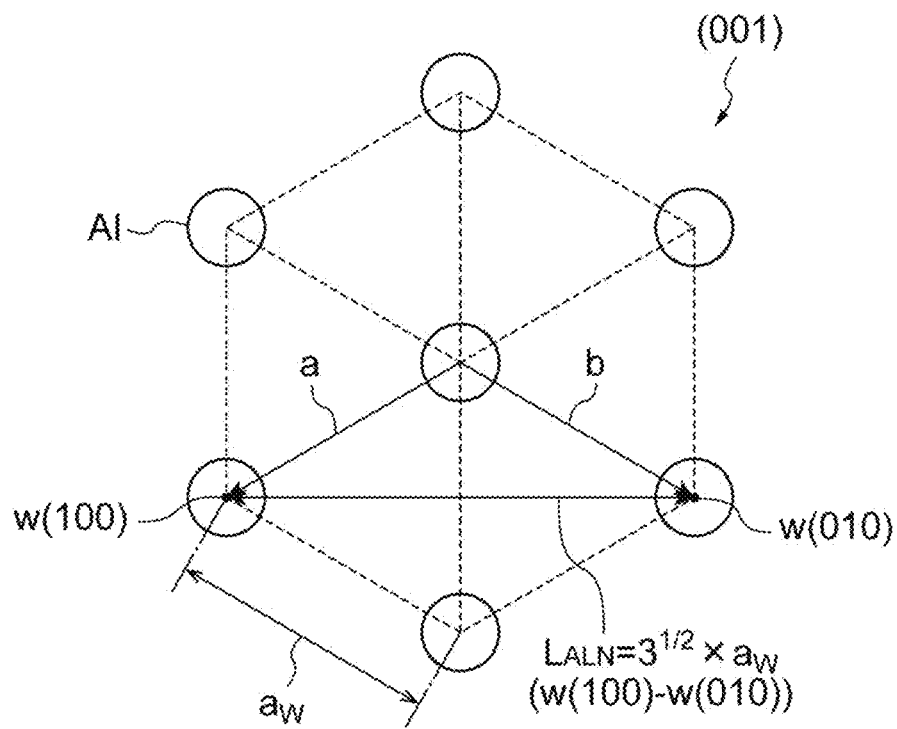
FIG. 5A illustrates a (001) plane and a lattice length $L_{ALN}$ of the wurtzite structure in FIG. 2 and FIG. 3.
Figure 5B:
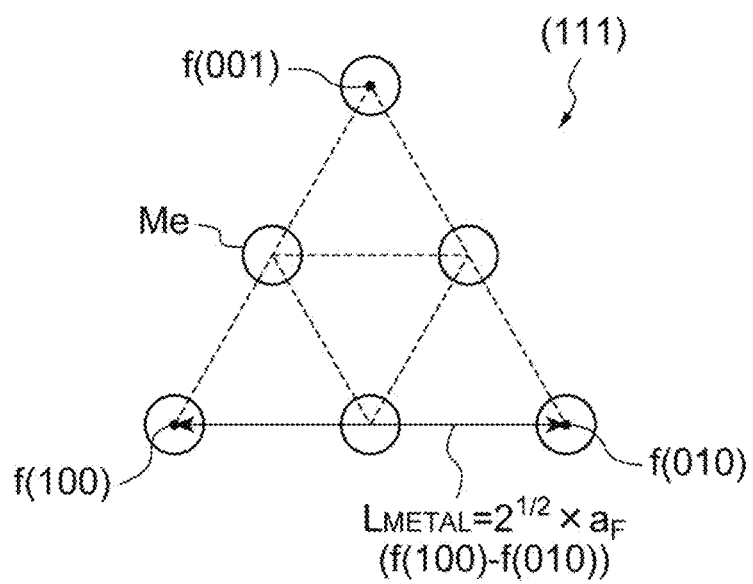
FIG. 5B illustrates a (111) plane and a lattice length $L_{METAL}$ of the face-centered cubic structure in FIG. 4.

The (111) plane of the fcc structure may be approximately parallel to the surface 4s of the first electrode layer 4 with which the piezoelectric thin film 2 is in contact. That is, the (111) plane of the fcc structure may be oriented in the normal direction $D_N$ of the surface 4s of the first electrode layer 4. As a result, the (001) plane of the wurtzite structure of the aluminum nitride (the piezoelectric thin film 2) is likely to be oriented in the normal direction $D_N$ of the surface 4s of the first electrode layer 4. Accordingly, the (001) plane of the wurtzite structure of the aluminum nitride (the piezoelectric thin film 2) may be approximately parallel to the (111) plane of the fcc structure of the metal Me (the first electrode layer 4). FIG. 5A illustrates the (001) plane of the wurtzite structure of the aluminum nitride. FIG. 5B illustrates the (111) plane of the fcc structure of the metal Me. In a case where the crystal structure of the metal Me is the fcc structure, as illustrated in FIG. 5A, the lattice length $L_{ALN}$ of the aluminum nitride is expressed by $3^{1/2} \times a_W$. That is, based on law of cosines, $L_{ALN}^2$ is equal to $a_W^2 + a_W^2 - 2 \times a_W \times a_W \times \cos 120°$. As described above, $a_W$ is a minimum interval of elements in the (001) plane of the wurtzite structure. As illustrated in FIG. 4 and FIG. 5B, the lattice length $L_{METAL}$ of the fcc structure of the metal Me is expressed by $2^{1/2} \times a_F$. That is, based on law of cosines, $L_{METAL}^2$ is equal to $a_F^2 + a_F^2 - 2 \times a_F \times a_F \times \cos 90°$. As described above, $a_F$ is a lattice constant of the fcc structure of the metal Me.

As described above, in a case where the crystal structure of the metal Me is the fcc structure, $L_{ALN}$ may be $3^{1/2} \times a_W$, $L_{METAL}$ may be $2^{1/2} \times a_F$, and $3^{1/2} \times a_W$ may be longer than $2^{1/2} \times a_F$. Based on the vector w(x y z) of the wurtzite structure, a direction of $3^{1/2} \times a_W$ (that is, $L_{ALN}$) is parallel to w(1 0 0)-w(0 1 0). Based on the vector f(x y z) of the fcc structure, a direction of $2^{1/2} \times a_F$ (that is, $L_{METAL}$) is parallel to f(1 0 0)-f(0 1 0). w(1 0 0)-w(0 1 0) that is a vector in the (001) plane of the wurtzite structure may be approximately parallel to f(1 0 0)-f(0 1 0) that is a vector in the (111) plane of the fcc structure. In other words, w(1 –1 0) that is a vector in the (0 0 1) plane of the wurtzite structure may be approximately parallel to f(1 –1 0) that is a vector in the (111) plane of the fcc structure.

Figure 6:
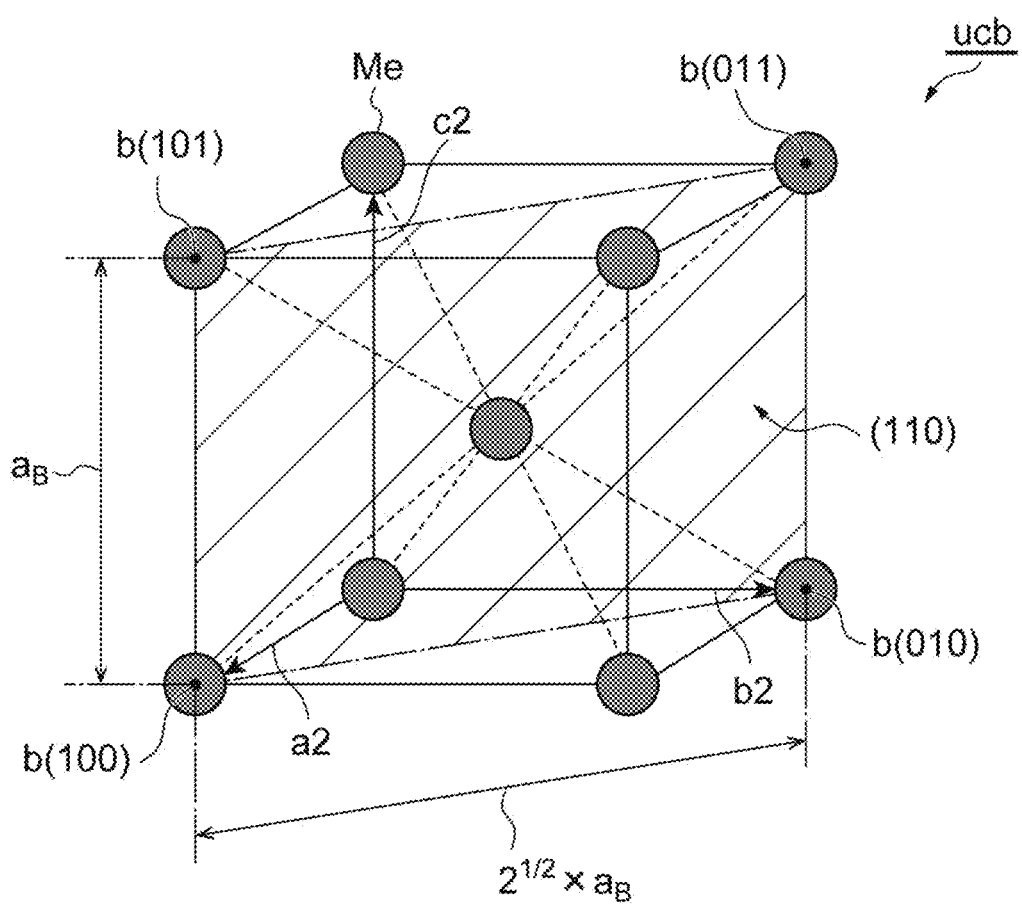
FIG. 6 is a perspective view of a unit cell of the body-centered cubic structure (metal Me).

The crystal structure of the metal Me may be a body-centered cubic structure (bcc structure). FIG. 6 illustrates a unit cell ucb of the bcc structure of the metal Me. The unit cell ucb is a cube. Each of a2, b2, and c2 in FIG. 6 is a basic vector of the bcc structure. A crystal orientation indicated by a2 is [100]. A crystal orientation indicated by b2 is [010]. A crystal orientation indicated by c2 is [001]. a2, b2, and c2 are orthogonal to each other. A length of each of a2, b2, and c2 is equal to a lattice constant $a_B$. That is, lengths of a2, b2, and c2 are equal to each other. An arbitrary position or direction in the unit cell ucb of the bcc structure may be expressed by a vector b(x y z) defined by the following Mathematical Formula b. For example, b(x y z) may represent a position of the metal element (Me) that constitutes the bcc structure.

$$b(x\ y\ z)=xa2+yb2+zc2 \qquad \text{(Mathematical Formula b)}$$

Each of x, y, and z in Mathematical Formula b is an arbitrary real number. Each of a2, b2, and c2 in Mathematical Formula b is the basic vector of the bcc structure.

Figure 7A:
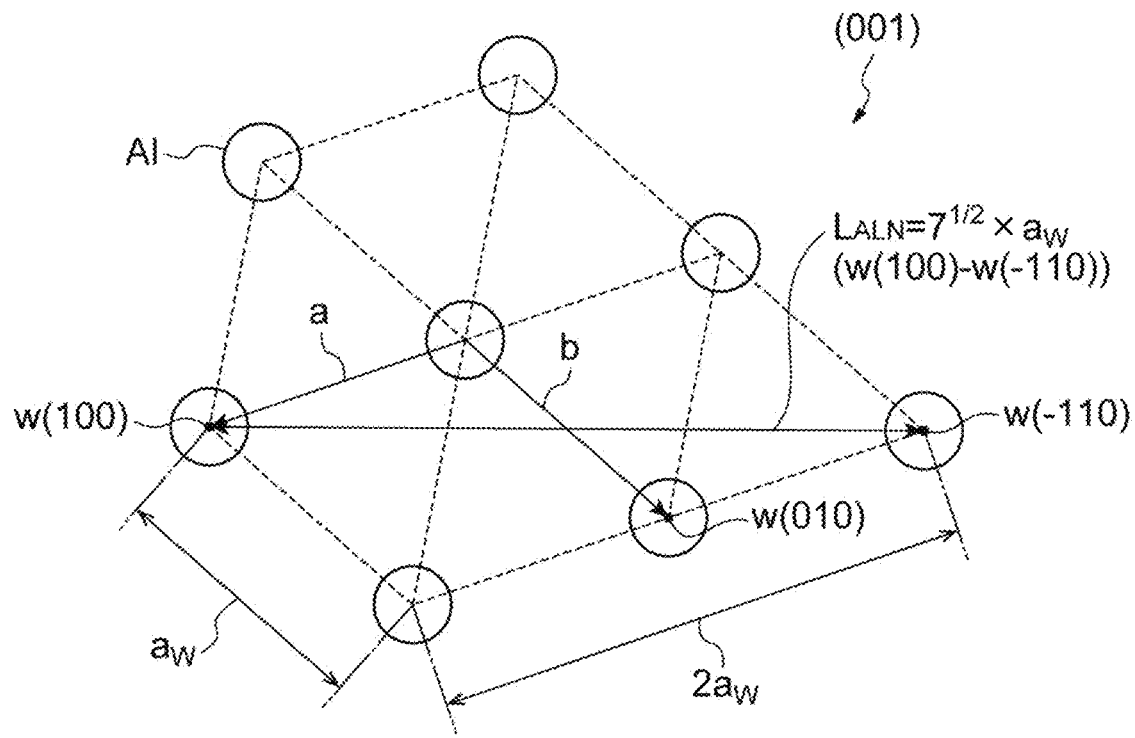
FIG. 7A illustrates a (001) plane and a lattice length $L_{ALN}$ of the wurtzite structure in FIG. 2 and FIG. 3.
Figure 7B:
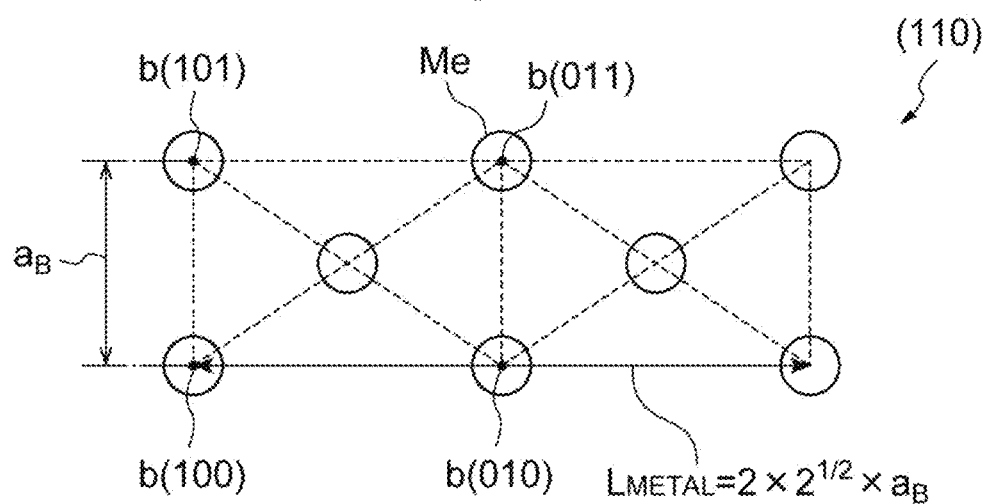
FIG. 7B illustrates a (110) plane and a lattice length $L_{METAL}$ of the body-centered cubic structure in FIG. 6.

A (110) plane of the bcc structure may be approximately parallel to the surface 4s of the first electrode layer 4 with which the piezoelectric thin film 2 is in contact. That is, the (110) plane of the bcc structure may be oriented in the normal direction $D_N$ of the surface 4s of the first electrode layer 4. As a result, the (001) plane of the wurtzite structure of the aluminum nitride (the piezoelectric thin film 2) is likely to be oriented in the normal direction $D_N$ of the surface 4s of the first electrode layer 4. Accordingly, the (001) plane of the wurtzite structure of the aluminum nitride (the piezoelectric thin film 2) may be approximately parallel to the (110) plane of the bcc structure of the metal Me (the first electrode layer 4). FIG. 7A illustrates a (001) plane of the wurtzite structure of the aluminum nitride. FIG. 7B illustrates a (110) plane of the bcc structure of the metal Me. In a case where the crystal structure of the metal Me is the bcc structure, as illustrated in FIG. 7A, the lattice length $L_{ALN}$ of the aluminum nitride is expressed by $7^{1/2} \times a_W$. That is, based on law of cosines, $L_{ALN}^2$ is equal to $a_W^2+(2a_W)^2-2 \times a_W \times 2a_W \times \cos 120°$. As described above, $a_W$ is a minimum interval of elements in the (001) plane of the wurtzite structure. As illustrated in FIG. 6 and FIG. 7B, the lattice length $L_{METAL}$ of the bcc structure of the metal Me is expressed by $2 \times 2^{1/2} \times a_B$. As described above, $a_B$ is a lattice constant of the bcc structure of the metal Me.

As described above, in a case where the crystal structure of the metal Me is the bcc structure, $L_{ALN}$ may be $7^{1/2} \times a_W$, $L_{METAL}$ may be $2 \times 2^{1/2} \times a_B$, and $7^{1/2} \times a_W$ may be longer than $2 \times 2^{1/2} \times a_B$. Based on the vector w(x y z) of the wurtzite structure, a direction of $7^{1/2} \times a_W$ (that is, $L_{ALN}$) is parallel to w(1 0 0)-w(-1 1 0). Based on the vector b(x y z) of the bcc structure, a direction of $2^{1/2} \times a_F$ (that is, $L_{METAL}$) is parallel to b(1 0 0)-b(0 1 0). w(1 0 0)-w(-1 1 0) that is a vector in the (001) plane of the wurtzite structure may be approximately parallel to b(1 0 0)-b(0 1 0) that is a vector in the (110) plane of the bcc structure. In other words, w(2 -1 0) that is a vector in the (001) plane of the wurtzite structure may be approximately parallel to b(1 -1 0) that is a vector in the (110) plane of the bcc structure. In a case where the crystal structure of the metal Me is the bcc structure, $L_{ALN}$ may be $3^{1/2} \times a_W$, $L_{METAL}$ may be $2 \times a_B$, and $3^{1/2} \times a_W$ may be longer than $2 \times a_B$.

Figure 8:
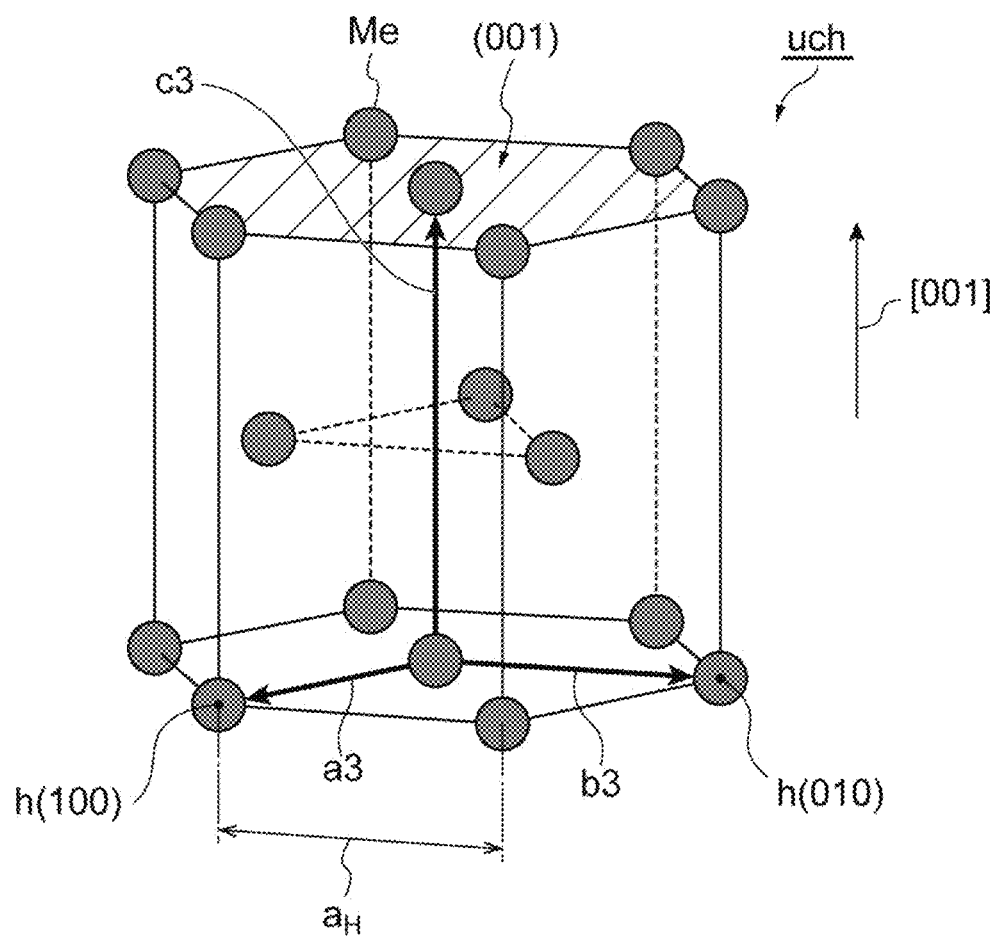
FIG. 8 is a perspective view of a unit cell of a hexagonal close-packed structure (metal Me).

The crystal structure of the metal Me may be a hexagonal close-packed structure (hcp structure). FIG. 8 illustrates a unit cell uch of the hcp structure of the metal Me. The unit cell uch is a regular hexagonal prism. Each of a3, b3, and c3 in FIG. 8 is a basic vector of the hcp structure. A crystal orientation indicated by a3 is [100]. A crystal orientation indicated by b3 is [010]. A crystal orientation indicated by c3 is [001]. a3 and b3 belong to the same crystal plane. An angle made by a3 and b3 is 120°. c3 is orthogonal to each of a3 and b3. $a_H$ in FIG. 8 is a minimum interval of the metal Me (elements Me) in the (001) plane of the hcp structure. $a_H$ may be referred to as a length of the basic vector a3 of the hcp structure. $a_H$ may be referred to as a lattice constant of the hcp structure in an a-axis direction. An arbitrary position or direction in the unit cell ucf of the hcp structure may be expressed by a vector h(x y z) defined by the following Mathematical Formula h. For example, h(x y z) may represent a position of the metal element (Me) that constitutes the hcp structure.

$$h(x\ y\ z)=xa3+yb3+zc3 \quad \text{(Mathematical Formula h)}$$

Each of x, y, and z in Mathematical Formula h is an arbitrary real number. Each of a3, b3, and c3 in Mathematical Formula h is a basic vector of the hcp structure.

Figure 9A:
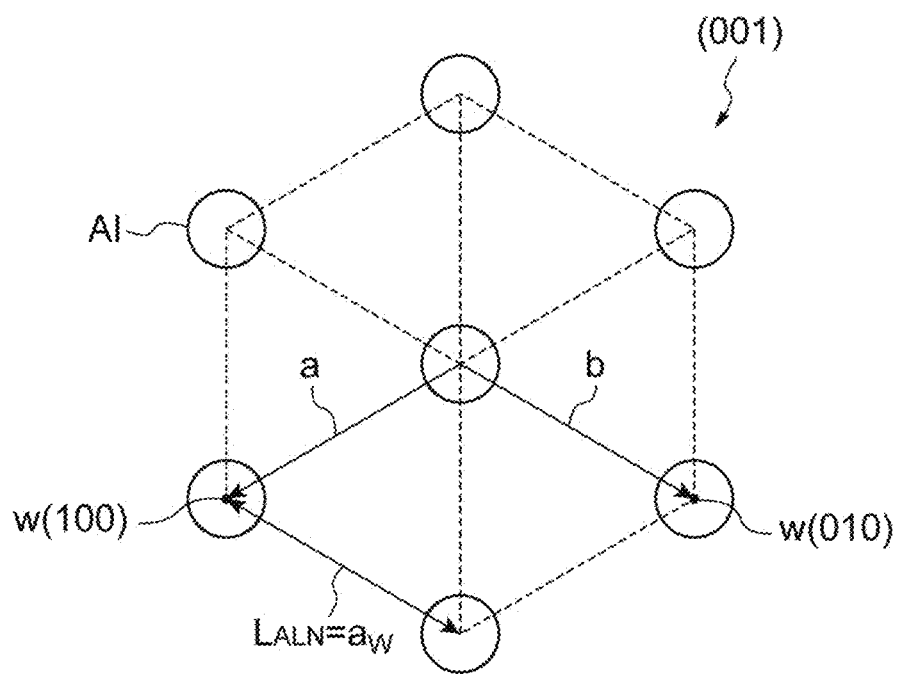
FIG. 9A illustrates a (001) plane and a lattice length $L_{ALN}$ of the wurtzite structure in FIG. 2 and FIG. 3.
Figure 9B:
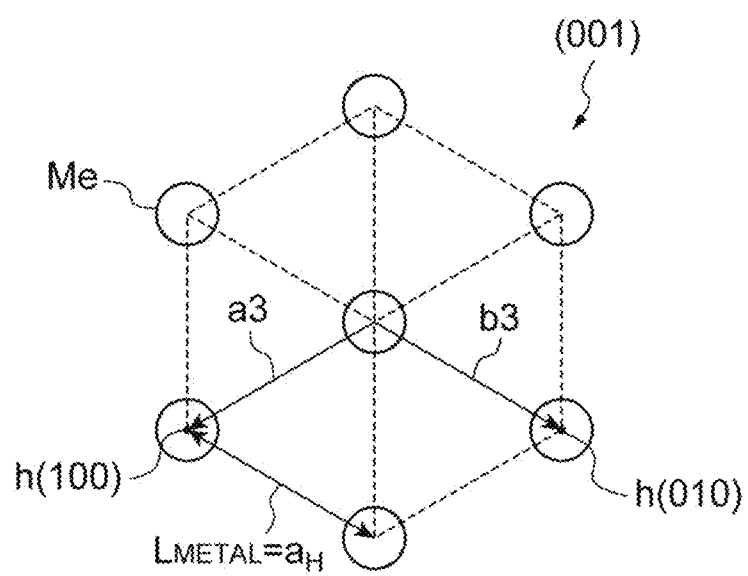
FIG. 9B illustrates a (001) plane and a lattice length $L_{METAL}$ of the hexagonal close-packed structure in FIG. 8.

A (001) plane of the hcp structure may be approximately parallel to the surface 4s of the first electrode layer 4 with which the piezoelectric thin film 2 is in contact. That is, the (001) plane of the hcp structure may be oriented in the normal direction $D_N$ of the surface 4s of the first electrode layer 4. As a result, the (001) plane of the wurtzite structure of the aluminum nitride (the piezoelectric thin film 2) is likely to be oriented in the normal direction $D_N$ of the surface 4s of the first electrode layer 4. Accordingly, the (001) plane of the wurtzite structure of the aluminum nitride may be approximately parallel to the (001) plane of the hcp structure of the metal Me (the first electrode layer 4). FIG. 9A illustrates the (001) plane of the wurtzite structure of the aluminum nitride. FIG. 9B illustrates the (001) plane of the hcp structure of the metal Me. In a case where the crystal structure of the metal Me is the hcp structure, as illustrated in FIG. 9A, the lattice length $L_{ALN}$ of the aluminum nitride is equal to $a_W$. As described above, $a_W$ is a minimum interval of elements in the (001) plane of the wurtzite structure. As illustrated in FIG. 8 and FIG. 9B, the lattice length $L_{METAL}$ of the hcp structure of the metal Me is equal to $a_H$. As described above, $a_H$ is a minimum interval of the metal Me (elements Me) in the (001) plane of the hcp structure.

As described above, in a case where the crystal structure of the metal Me is the hcp structure, $L_{ALN}$ may be $a_W$, $L_{METAL}$ may be $a_H$, and $a_W$ may be longer than $a_H$. Based on the vector w(x y z) of the wurtzite structure, a direction of $a_W$ (that is, $L_{ALN}$) is parallel to w(0 1 0). Based on the vector h(x y z) of the hcp structure, a direction of $a_H$ (that is, $L_{METAL}$) is parallel to h(0 1 0). w(0 1 0) that is a vector in the (001) plane of the wurtzite structure may be approximately parallel to h(0 1 0) that is a vector in the (001) plane of the hcp structure. In a case where the crystal structure of the metal Me is the hcp structure, $L_{ALN}$ may be $3^{1/2} \times a_W$, $L_{METAL}$ may be $2 \times a_H$, and $3^{1/2} \times a_W$ may be longer than $2 \times a_H$.

The degree of lattice mismatching ΔL may be defined as $(L_{ALN}-L_{METAL})/L_{METAL}$. That is, ΔL may be the degree of lattice mismatching between the first electrode layer 4 and the piezoelectric thin film 2. ΔL may be greater than 0% and equal to or less than 8.0%. That is, $100 \times (L_{ALN}-L_{METAL})/L_{METAL}$ may be greater than 0 and equal to or less than 8.0. When ΔL is adjusted to a value within the range, a compressive stress in the piezoelectric thin film 2 is likely to be controlled to a desired value. In addition, when ΔL is adjusted to the value within the range, the (001) plane of the wurtzite structure of aluminum nitride is likely to be oriented in the normal direction $D_N$ of the surface 4s of the first electrode layer 4, and the piezoelectric property of the piezoelectric thin film 2 is likely to be improved. From the same reason, ΔL may be from 0.1% to 7.0%, from 0.4% to 7.0%, from 0.8% to 7.0%, from 1.0% to 7.0%, or from 3.0% to 6.3%. $L_{METAL}$ is a value uniquely determined in correspondence with a composition and a crystal structure of the metal Me. Accordingly, ΔL may be controlled by adjusting $L_{ALN}$.

$L_{ALN}$ may be calculated on the basis of a measurement value of $a_W$. $L_{METAL}$ may be calculated on the basis of a measurement value of $a_F$, $a_B$, or $a_H$. $a_W$, $a_F$, $a_B$, and $a_H$ may be measured by an X-ray diffraction (XRD) method. $a_W$, $a_F$, $a_B$, and $a_H$ may be measured under an atmosphere of a normal temperature (for example, 5 to 35° C.). The crystal structure of the metal Me may be specified by the XRD method.

The compressive stress that occurs in the piezoelectric thin film 2 may be greater than 0 MPa and equal to or less than 1500 MPa. As described above, the compressive stress may be approximately parallel to the surface 4s of the first electrode layer 4. In a case where the compressive stress is within the above-described range, spontaneous breakage of the piezoelectric thin film 2 is likely to be suppressed. From the same reason, the compressive stress that occurs in the piezoelectric thin film 2 may be from 50 MPa to 1000 MPa, from 182 MPa to 822 MPa, from 288 MPa to 822 MPa, or from 392 MPa to 822 MPa.

The divalent metal element Md contained in the aluminum nitride may be at least one kind selected from the group consisting of magnesium (Mg), calcium (Ca), strontium (Sr), and barium (Ba). The tetravalent metal element Mt contained in the AlN may be at least one kind selected from the group consisting of germanium (Ge), titanium (Ti), zirconium (Zr), and hafnium (Hf). It is preferable that the aluminum nitride contains at least magnesium as the Md, and at least one kind of element selected from the group consisting of zirconium, hafnium, and titanium as the Mt. As a result, the spontaneous breakage of the piezoelectric thin film 2 is likely to be suppressed, and the piezoelectric property of the piezoelectric thin film 2 is likely to be improved.

The piezoelectric thin film 2 may further contain another element in addition to Al, N, Md, and Mt as long as the wurtzite structure and the piezoelectric property of the piezoelectric thin film 2 are not damaged. For example, the piezoelectric thin film 2 may further contain at least one kind of element selected from the group consisting of a monovalent metal element Mm, a trivalent metal element Mtr, and a pentavalent metal element Mp. The monovalent metal element Mm may be at least one kind of element selected from the group consisting of lithium (Li), sodium (Na), potassium (K), rubidium (Rb), and cesium (Cs). The trivalent metal element Mtr may be at least one kind of element selected from the group consisting of scandium (Sc), yttrium (Y), lanthanoid, and indium (In). The pentavalent metal element Mp may be at least one kind of element selected from the group consisting of chromium (Cr), vanadium (V), niobium (Nb), and tantalum (Ta). A total amount of Mm contained in the aluminum nitride may be expressed by [Mm] atom %. A total amount of Mp contained in the aluminum nitride may be expressed by [Mp] atom %. [Mm]/[Mp] may be approximately 1.0.

For example, the thickness of the piezoelectric thin film 2 in the normal direction $D_N$ of the surface 4s of the first electrode layer 4 may be from 0.1 μm to 30 μm. The thickness of the piezoelectric thin film 2 may be approximately uniform.

As described above, the piezoelectric thin film device 10a may contain the substrate 1, the adhesion layer 8 that directly overlaps the substrate 1, the first electrode layer 4 that directly overlaps the adhesion layer 8, the piezoelectric thin film 2 that directly overlaps the first electrode layer 4, and the second electrode layer 12 that directly overlaps the piezoelectric thin film 2.

For example, the substrate 1 may be a semiconductor substrate (a silicon substrate, a gallium arsenide substrate, or the like), an optical crystal substrate (a sapphire substrate or the like), an insulator substrate (a glass substrate, a ceramics substrate, or the like), or a metal substrate (a stainless steel plate or the like).

The metal Me contained in the first electrode layer 4 may be at least one kind of element selected from the group consisting of platinum (Pt), iridium (Ir), gold (Au), rhodium (Rh), palladium (Pd), silver (Ag), nickel (Ni), copper (Cu), aluminum (Al), molybdenum (Mo), tungsten (W), vanadium (V), chromium (Cr), niobium (Nb), tantalum (Ta), ruthenium (Ru), zirconium (Zr), hafnium (Hf), titanium (Ti), yttrium (Y), scandium (Sc), and magnesium (Mg). The first electrode layer 4 may be an alloy containing at least two kinds of elements selected from the above-described group as the metal Me. The first electrode layer 4 may be a simple substance of the metal Me. In a case where the metal Me is at least one kind of element selected from the group consisting of Pt, Ir, Au, Rh, Pd, Ag, Ni, Cu, and Al, the metal Me is likely to have the fcc structure, and the (111) plane of the fcc structure is likely to be oriented in the normal direction $D_N$ of the surface 4s of the first electrode layer 4. In a case where the metal Me is at least one kind of element selected from the group consisting of Mo, W, V, Cr, Nb, and Ta, the metal Me is likely to have the bcc structure, and the (110) plane of the bcc structure is likely to be oriented in the normal direction $D_N$ of the surface 4s of the first electrode layer 4. In a case where the metal Me is at least one kind of element selected from the group consisting of Ru, Zr, Hf, Ti, Y, Sc, and Mg, the metal Me is likely to have the hcp structure, and the (001) plane of the hcp structure is likely to be oriented in the normal direction $D_N$ of the surface 4s of the first electrode layer 4.

The first electrode layer 4 may be stacked directly on a surface of the substrate 1. The adhesion layer 8 may be interposed between the first electrode layer 4 and the substrate 1. The adhesion layer 8 is at least one kind selected from the group consisting of aluminum (Al), silicon (Si), titanium (Ti), zinc (Zn), yttrium (Y), zirconium (Zr), chrome (Cr), niobium (Nb), molybdenum (Mo), hafnium (Hf), tantalum (Ta), tungsten (W), and cerium (Ce). The adhesion layer 8 may be a simple substance of a metal, an alloy, or a compound (oxide or the like). The adhesion layer 8 may be constituted by another piezoelectric thin film, a polymer, or ceramics. Due to the interposition of the adhesion layer 8, the (111) plane of the fcc structure of the first electrode layer 4 is likely to be oriented in the normal direction $D_N$ of the surface 4s of the first electrode layer 4. Alternatively, due to the interposition of the adhesion layer 8, the (110) plane of the bcc structure of the first electrode layer 4 is likely to be oriented in the normal direction $D_N$ of the surface 4s of the first electrode layer 4. Alternatively, due to the interposition of the adhesion layer 8, the (001) plane of the hcp structure of the first electrode layer 4 is likely to be oriented in the normal direction $D_N$ of the surface of the first electrode layer 4. The adhesion layer 8 also has a function of suppressing peeling-off of the first electrode layer 4 due to mechanical impact or the like. The adhesion layer 8 may be referred to as an interface layer, a support layer, a buffer layer, or an intermediate layer.

The second electrode layer 12 may contain at least one kind of element selected from the group consisting of Pt, Ir, Au, Rh, Pd, Ag, Ni, Cu, Al, Mo, W, V, Cr, Nb, Ta, Ru, Zr, Hf, Ti, Y, Sc, and Mg. The second electrode layer 12 may be an alloy containing at least two kinds of elements selected from the above-described group. The second electrode layer 12 may be a simple substance of a metal.

For example, the thickness of the substrate 1 may be from 50 μm to 10000 μm. For example, the thickness of the adhesion layer 8 may be from 0.003 μm to 1 μm. For example, the thickness of the first electrode layer 4 may be from 0.01 μm to 1 μm. For example, the thickness of the second electrode layer 12 may be from 0.01 μm to 1 μm.

Each of the adhesion layer 8, the first electrode layer 4, the piezoelectric thin film 2, and the second electrode layer 12 may be formed in a stacking order by sputtering using at least one kind of target. Each of the adhesion layer 8, the first electrode layer 4, the piezoelectric thin film 2, and the second electrode layer 12 may be formed by sputtering (co-sputtering or multi-sputtering) using a plurality of targets. Each of the targets may contain at least one kind among elements which constitute each of the layers or the piezoelectric thin film. Each of the layers and the piezoelectric thin film 2 which have a desired composition can be formed by selection and combination of targets having a predetermined composition. For example, the target may be a simple substance of a metal, an alloy, or an oxide. A composition of a sputtering atmosphere determines a composition of each of the layers and the piezoelectric thin film 2. For example, the sputtering atmosphere for forming the piezoelectric thin film 2 may be a nitrogen gas. The sputtering atmosphere for forming the piezoelectric thin film 2 may be a mixed gas containing a rare gas (for example, argon) and nitrogen. Input power (power density) applied to each target is a control factor of the composition and the thickness of each of the layers and the piezoelectric thin film 2. A total pressure of the sputtering atmosphere, a partial pressure or a concentration of a raw material gas (for example, nitrogen) in the atmosphere, a duration of sputtering for each target, a temperature of a substrate surface on which the piezoelectric thin film is formed, a substrate bias, or the like is also a control factor of the composition and thickness of each of the layers and the piezoelectric thin film 2. A piezoelectric thin film having a desired shape or pattern may be formed by etching (for example, plasma etching).

For example, a film formation temperature of the piezoelectric thin film 2 may be from 300° C. to 500° C. The film formation temperature of the piezoelectric thin film 2 may be referred to as a temperature of the first electrode layer 4 in a process of forming the piezoelectric thin film 2. A coefficient of thermal expansion of the metal Me in the first electrode layer 4 tends to be greater than a coefficient of thermal expansion of the aluminum nitride in the piezoelectric thin film 2. In addition, in a case where the film formation temperature of the piezoelectric thin film 2 is 300° C. or higher, in the process of forming the piezoelectric thin film 2, the first electrode layer 4 is likely to be significantly expanded in comparison to the piezoelectric thin film 2. In addition, in a process in which a temperature of each of the first electrode layer 4 and the piezoelectric thin film 2 is lowered after forming the piezoelectric thin film 2, the first electrode layer 4 is likely to be significantly contracted in comparison to the piezoelectric thin film 2. Since the piezoelectric thin film 2 and the first electrode layer 4 undergo the above-described series of processes, $L_{AlN}$ is likely to be controlled to a value larger than $L_{METAL}$.

A crystal structure of the adhesion layer 8, the first electrode layer 4, the piezoelectric thin film 2, and the second electrode layer 12 may be specified by an X-ray diffraction method (XRD). A composition of each of the layers and the piezoelectric thin film 2 may be specified by at least any one analysis method among X-ray fluorescent analysis (XRF method), energy dispersive X-ray analysis (EDX), inductively coupled plasma mass spectrometry (ICP-MS), laser ablation inductively coupled plasma mass spectrometry (LA-ICP-MS), and electron probe micro analyzer (EPMA). The thickness of each of the adhesion layer 8, the first electrode layer 4, the piezoelectric thin film 2, and the second electrode layer 12 may be measured by a scanning electron microscope (SEM) on a cross-section of the piezoelectric thin film device 10a which is parallel to the normal direction $D_N$ of the surface 4s of the first electrode layer 4.

The piezoelectric thin film device according to this embodiment has various applications. For example, the piezoelectric thin film device may be a piezoelectric microphone, a harvester, an oscillator, a resonator, or an acoustic multilayer film. For example, the piezoelectric thin film device may be a piezoelectric actuator. The piezoelectric actuator may be used in haptics. That is, the piezoelectric actuator may be used in various devices which require feedback by cutaneous sensation (haptic sense). Examples of the devices which require feedback by cutaneous sensation may include a wearable device, a touch pad, a display, and a game controller. For example, the piezoelectric actuator may be used in a head assembly, a head stack assembly, or a hard disk drive. For example, the piezoelectric actuator may be used in a printer head, or an inkjet printer device. The piezoelectric actuator may be used in a piezoelectric switch. For example, the piezoelectric thin film device may be a piezoelectric sensor. For example, the piezoelectric sensor may be used as a gyro sensor, a pressure sensor, a pulse wave sensor, an ultrasonic sensor, an ultrasonic transducer such as a piezoelectric micromachined ultrasonic transducer (PMUT), or a shock sensor. Each of the above-described piezoelectric thin film devices may be a part or the entirety of the MEMS.

EXAMPLES

Hereinafter, the invention will be described in detail with reference to examples and comparative examples. The invention is not limited to the examples at all.

Example 1

As a substrate, a silicon (Si) single crystal was used. An adhesion layer consisting of Ti was formed directly on the entirety of a surface of the substrate by RF magnetron sputtering in a vacuum chamber. The surface of the substrate on which the adhesion layer is formed was parallel to a (100) plane of Si. The thickness of the substrate was 625 μm. The thickness of the substrate was uniform. The thickness of the adhesion layer was 0.03 μm. The thickness of the adhesion layer was uniform. An atmosphere inside the vacuum chamber was an Ar gas. A temperature of the substrate in a process of forming the adhesion layer was maintained at 300° C. As a sputtering target, a simple substance of Ti was used. Input power per unit area of the sputtering target was 9.87 W/cm².

A first electrode layer (lower electrode layer) consisting of a metal Me was formed directly on the entirety of a surface of the adhesion layer by RF magnetron sputtering in a vacuum chamber. As a sputtering target, a simple substance of Me was used. Me used in Example 1 is shown in the following Table 1. The thickness of the first electrode layer was 0.3 μm. The thickness of the first electrode layer was uniform. An atmosphere inside the vacuum chamber was an Ar gas. A temperature of the substrate and the adhesion layer in the process of forming the first electrode layer was maintained at 300° C. Input power per unit area of the sputtering target was 9.87 W/cm². In the vacuum chamber, the first electrode layer was annealed at 500° C. An atmosphere inside the vacuum chamber in which the annealing was performed was a mixed gas of Ar and $N_2$. A duration of the annealing was 10 minutes.

A piezoelectric thin film was formed directly on the entirety of a surface of the first electrode layer by RF magnetron sputtering in a vacuum chamber. The piezoelectric thin film consisted of aluminum nitride containing Md and Mt. Md and Mt contained in the aluminum nitride in Example 1 are shown in the following Table 1. As a sputtering target, an Al—Ca alloy, and a Ge metal were used. In Example 1, input power (power density) of each of the sputtering targets was adjusted so that ([Md]+[Mt])/([Al]+[Md]+[Mt]) matches 60 atom %. Definition of ([Md]+[Mt])/([Al]+[Md]+[Mt]) is as described above. [Md+Mt] in the following description represents ([Md]+[Mt])/([Al]+[Md]+[Mt]). The thickness of the piezoelectric thin film was uniform. An atmosphere inside the vacuum chamber was a mixed gas of Ar and $N_2$. A temperature of the substrate, the adhesion layer, and the first electrode layer in the process of forming the piezoelectric thin film was maintained at 300° C. The thickness of the piezoelectric thin film was 1.3 μm.

A second electrode layer was formed directly on the entirety of a surface of the piezoelectric thin film in a similar method as in the case of the first electrode layer. A composition of the second electrode layer was completely the same as a composition of the first electrode layer. The thickness of the second electrode layer was completely the same as the thickness of the first electrode layer. The thickness of the second electrode layer was uniform.

A stacked body containing the substrate, the adhesion layer stacked directly on the substrate, the first electrode layer stacked directly on the adhesion layer, the piezoelectric thin film stacked directly on the first electrode layer, and the second electrode layer stacked directly on the piezoelectric thin film was manufactured in the above-described procedure. Patterning of the stacked structure on the substrate was performed by the subsequent photolithography. After the patterning, the entirety of the stacked body was cut out by dicing to obtain a rectangular piezoelectric thin film device of Example 1. The piezoelectric thin film device contained the substrate, the adhesion layer stacked directly on the substrate, the first electrode layer stacked directly on the adhesion layer, the piezoelectric thin film stacked directly on the first electrode layer, and the second electrode layer stacked directly on the piezoelectric thin film. A surface of the piezoelectric thin film was parallel to each of the surface of the substrate and the surface of the first electrode layer.

A plurality of the piezoelectric thin film devices of Example 1 were manufactured by the above-described method. The following analysis and measurement on the piezoelectric thin film devices were performed.

[Composition of Piezoelectric Thin Film]

A composition of the piezoelectric thin film was specified by X-ray fluorescent analysis (XRF method) and laser ablation inductively coupled plasma mass spectrometry (LA-ICP-MS). In the XRF method, a wavelength dispersive fluorescent X-ray device (AZX-400) manufactured by Rigaku Corporation was used. In the LA-ICP-MS method, an analyzer (7500s) manufactured by Agilent Technologies, Inc. was used.

As a result of analysis based on the XRF method, it was confirmed that the piezoelectric thin film consists of aluminum nitride expressed by the following Chemical Formula A. α+β in the following Chemical Formula A is equal to [Md+Mt]/100. Definition of [Md+Mt] is as described above. α/β was 1.0.

$$Al_{\{1-(\alpha+\beta)\}}Md_\alpha Mt_\beta N \qquad (A)$$

[Crystal Structure]

Before forming the second electrode layer, a crystal structure of each of the first electrode layer and the piezoelectric thin film was specified by the X-ray diffraction (XRD) method. In the XRD method, a multi-purpose X-ray diffraction device (SmartLab) manufactured by Rigaku Corporation was used. 2θχ-φ scanning and 2θχ scanning using the X-ray diffraction device were performed on the surface of the piezoelectric thin film formed directly on the first electrode layer. As a result of analysis based on the XRD method, it was confirmed that the piezoelectric thin film has the wurtzite structure. The (001) plane of the wurtzite structure was parallel to the surface of the first electrode layer with which the piezoelectric thin film is in contact. The first electrode layer (metal Me) had a crystal structure shown in the following Table 1. A crystal plane of Me shown in the following Table 1 was parallel to the surface of the first electrode layer with which the piezoelectric thin film is in contact.

The lattice length $L_{ALN}$ of aluminum nitride was calculated from the lattice constant $a_W$ of the aluminum nitride which was measured by the XRD method. The lattice length $L_{METAL}$ of the metal Me was calculated from the lattice constant $a_F$ of the metal Me which was measured by the XRD method. $L_{ALN}$ of Example 1 is expressed by $3^{1/2} \times a_W$. $L_{METAL}$ of Example 1 is expressed by $2^{1/2} \times a_F$. The degree of lattice mismatching ΔL was calculated from $L_{ALN}$ and $L_{METAL}$. As described above, ΔL is defined as $(L_{ALN} - L_{METAL})/L_{METAL}$. Positive ΔL represents that $L_{ALN}$ is longer than $L_{METAL}$. Negative ΔL represents that $L_{ALN}$ is shorter than $L_{METAL}$. $L_{ALN}$, $L_{METAL}$, and ΔL of Example 1 are shown in the following Table 1.

[Residual Stress σ]

A residual stress σ (unit: MPa) in the piezoelectric thin film was calculated in the following procedure. First, a radius of curvature $R_{Before}$ (unit: μm) of the substrate immediately before the piezoelectric thin film is formed was measured. The substrate immediately before the piezoelectric thin film is formed represents a stacked body consisting of the substrate, the adhesion layer, and the first electrode layer. Next, a radius of curvature $R_{After}$ (unit: μm) of the substrate after the piezoelectric thin film is formed was measured. The substrate after the piezoelectric thin film is formed represents a stacked body consisting of the substrate, the adhesion layer, the first electrode layer, and the piezoelectric thin film. In the measurement of $R_{Before}$ and $R_{After}$, a measurement device (P-16 profiler) manufactured by KLA-Tencor Corporation was used. In addition, the residual stress σ was calculated on the basis of the following Mathematical Formula 1 (Stoney's formula).

[Mathematical Formula 1]

$$\sigma = \frac{1}{6} \times \left( \frac{1}{R_{After}} - \frac{1}{R_{Before}} \right) \times \frac{E}{1-v_s} \times \frac{t_{sub.}^2}{t_{film}} \qquad (1)$$

E in Mathematical Formula 1 represents Young's modulus (unit: GPa) of a substrate consisting of silicon. $v_s$ represents a Poisson's ratio of the substrate consisting of silicon. $t_{sub.}$ (unit: μm) represents the thickness of the substrate consisting of silicon. $t_{film}$ (unit: μm) represents the thickness of the piezoelectric thin film.

A positive residual stress σ represents a tensile stress. A negative residual stress σ represents a compressive stress. The residual stress σ in Example 1 is shown in the following Table 1.

<Breakage Ratio $R_{BREAK}$>

A plate-shaped piezoelectric thin film device of Example 1 was manufactured by the above-described method. Dimensions of the plate-shaped piezoelectric thin film device were 100 mm×100 mm. The piezoelectric thin film device was cut out to prepare 100 samples of 10 mm square. Each of the samples is a chip-shaped piezoelectric thin film device. Among the 100 samples, the number n of samples in which a crack is formed in the piezoelectric thin film was counted by an optical microscope. The breakage ratio $R_{BREAK}$ is defined as n %. The breakage ratio $R_{BREAK}$ in Example 1 is shown in the following Table 1.

<Half-Width of Rocking Curve>

Before forming the second electrode layer, a rocking curve of a (002) plane of the piezoelectric thin film was measured. In the measurement, the above X-ray diffraction device was used. A measurement range (a range of a diffraction angle 2θ) of the rocking curve was 34 to 37°. A measurement interval was 0.01°. A measurement speed was 2.0°/minute. A full width at half maximum FWHM of the rocking curve of the (002) plane of the piezoelectric thin film in Example 1 is shown in the following Table 1. The smaller the FWHM is, the higher crystallinity of aluminum nitride is and the more the (002) plane of the aluminum nitride which is oriented in the normal direction of the surface of the first electrode layer is.

<Piezoelectric Constant $d_{33}$>

A piezoelectric constant $d_{33}$ (unit: pC/N) of the piezoelectric thin film of Example 1 was measured. Details of measurement of the piezoelectric constant $d_{33}$ were as follows. The piezoelectric constant $d_{33}$ (three measurement-point average value) in Example 1 is shown in the following Table 1.

Measurement device: $d_{33}$ meter (PM200) manufactured by Piezotest Pte. Ltd.
Frequency: 110 Hz
Clamp pressure: 0.25 N Examples 2 to 16 and Comparative Examples 1 to 4

In manufacturing of the first electrode layer of each of Examples 2 to 16 and Comparative Examples 1 to 4, a sputtering target consisting of a metal Me as shown in the following Table 1 was used.

Md and Mt contained in aluminum nitride of each of Examples 2 to 16 and Comparative Examples 1 to 4 are shown in the following Table 1.

In manufacturing of the piezoelectric thin film of each of Examples 2, 3, 8, 9, and 14 to 16, and Comparative Examples 1 and 2, an Al metal, an Mg metal, and a Zr metal were used as a sputtering target. In the manufacturing of the piezoelectric thin film of each of Examples 2, 3, 8, 9, and 14 to 16, and Comparative Examples 1 and 2, input power of each sputtering target was adjusted so that [Md+Mt] matches a value shown in the following Table 1.

In the manufacturing of the piezoelectric thin film of each of Examples 4, 5, 10, and 11, and Comparative Example 3, an Al metal, an Mg metal, and a Hf metal were used as the sputtering target. In the manufacturing of the piezoelectric thin film of each of Examples 4, 5, 10, and 11, and Comparative Example 3, input power of each sputtering target was adjusted so that [Md+Mt] matches a value shown in the following Table 1.

In the manufacturing of the piezoelectric thin film of each of Examples 6, 7, 12, and 13, and Comparative Example 4, an Al metal, an Mg metal, and a Ti metal were used as the sputtering target. In the manufacturing of the piezoelectric thin film of each of Examples 6, 7, 12, and 13, and Comparative Example 4, input power of each sputtering target was adjusted so that [Md+Mt] matches a value shown in the following Table 1.

The piezoelectric thin film device of each of Examples 2 to 16, and Comparative Examples 1 to 4 was manufactured in a similar method as in Example 1 except for the above-described configurations. Analysis and measurement on the piezoelectric thin film device of each of Examples 2 to 16, and Comparative Examples 1 to 4 was performed in a similar method as in Example 1.

In any case of Examples 2 to 16, and Comparative Examples 1 to 4, it was confirmed that the piezoelectric thin film consists of aluminum nitride expressed by the following Chemical Formula A. In any case of Examples 2 to 16, and Comparative Examples 1 to 4, α+β in the following Chemical Formula A was equal to [Md+Mt]/100, and α/β was 1.0.

$$Al_{\{1-(\alpha+\beta)\}}Md_\alpha Mt_\beta N \quad (A)$$

In any case of Examples 2 to 16, and Comparative Examples 1 to 4, the piezoelectric thin film had the wurtzite structure. In any case of Examples 2 to 16, and Comparative Examples 1 to 4, the (001) plane of the wurtzite structure was parallel to the surface of the first electrode layer with which the piezoelectric thin film is in contact. In the case of each of Examples 2 to 16, and Comparative Examples 1 to 4, the first electrode layer (metal Me) had a crystal structure shown in the following Table 1. In the case of each of Examples 2 to 16, and Comparative Examples 1 to 4, a crystal plane of Me shown in the following Table 1 was parallel to the surface of the first electrode layer with which the piezoelectric thin film is in contact.

In the case of Example 2, $L_{ALN}$ is expressed by $3^{1/2} \times a_W$, and $L_{METAL}$ is expressed by $2^{1/2} \times a_F$.

In the case of Example 3, $L_{ALN}$ is expressed by $3^{1/2} \times a_W$, and $L_{METAL}$ is expressed by $2^{1/2} \times a_F$.

In the case of Example 4, $L_{ALN}$ is expressed by $3^{1/2} \times a_W$, and $L_{METAL}$ is expressed by $2^{1/2} \times a_F$.

In the case of Example 5, $L_{ALN}$ is expressed by $3^{1/2} \times a_W$, and $L_{METAL}$ is expressed by $2^{1/2} \times a_F$.

In the case of Example 6, $L_{ALN}$ is expressed by $3^{1/2} \times a_W$, and $L_{METAL}$ is expressed by $2^{1/2} \times a_F$.

In the case of Example 7, $L_{ALN}$ is expressed by $3^{1/2} \times a_W$, and $L_{METAL}$ is expressed by $2^{1/2} \times a_F$.

In the case of Example 8, $L_{ALN}$ is expressed by $a_W$, and $L_{METAL}$ is expressed by $a_H$.

In the case of Example 9, $L_{ALN}$ is expressed by $3^{1/2} \times a_W$, and $L_{METAL}$ is expressed by $2^{1/2} \times a_F$.

In the case of Example 10, $L_{ALN}$ is expressed by $a_W$, and $L_{METAL}$ is expressed by $a_H$.

In the case of Example 11, $L_{ALN}$ is expressed by $3^{1/2} \times a_W$, and $L_{METAL}$ is expressed by $2^{1/2} \times a_F$.

In the case of Example 12, $L_{ALN}$ is expressed by $a_W$, and $L_{METAL}$ is expressed by $a_H$.

In the case of Example 13, $L_{ALN}$ is expressed by $3^{1/2} \times a_W$, and $L_{METAL}$ is expressed by $2^{1/2} \times a_F$.

In the case of Example 14, $L_{ALN}$ is expressed by $7^{1/2} \times a_W$, and $L_{METAL}$ is expressed by $2 \times 2^{1/2} \times a_B$.

In the case of Example 15, $L_{ALN}$ is expressed by $3^{1/2} \times a_W$, and $L_{METAL}$ is expressed by $2 \times a_B$.

In the case of Example 16, $L_{ALN}$ is expressed by $3^{1/2} \times a_W$, and $L_{METAL}$ is expressed by $2 \times a_H$.

In the case of Comparative Example 1, $L_{ALN}$ is expressed by $3^{1/2} \times a_W$, and $L_{METAL}$ is expressed by $2^{1/2} \times a_F$.

In the case of Comparative Example 2, $L_{ALN}$ is expressed by $3^{1/2} \times a_W$, and $L_{METAL}$ is expressed by $2^{1/2} \times a_F$.

In the case of Comparative Example 3, $L_{ALN}$ is expressed by $3^{1/2} \times a_W$, and $L_{METAL}$ is expressed by $2^{1/2} \times a_F$.

In the case of Comparative Example 4, $L_{ALN}$ is expressed by $3^{1/2} \times a_W$, and $L_{METAL}$ is expressed by $2^{1/2} \times a_F$.

$L_{ALN}$, $L_{METAL}$, and the degree of lattice mismatching $\Delta L$ of each of Examples 2 to 16, and Comparative Examples 1 to 4 are shown in the following Table 1.

The residual stress σ of each of Examples 2 to 16, and Comparative Examples 1 to 4 is shown in the following Table 1.

The breakage ratio $R_{BREAK}$ of each of Examples 2 to 16, and Comparative Examples 1 to 4 is shown in the following Table 1.

The full width at half maximum FWHM of the rocking curve of each of Examples 2 to 16, and Comparative Examples 1 to 4 is shown in the following Table 1.

The piezoelectric constant $d_{33}$ of each of Examples 2 to 16, and Comparative Examples 1 to 4 is shown in the following Table 1.

It is preferable that the residual stress σ is a negative value (that is, a compressive stress). A target value of σ is from −1500 MPa to 0 MPa.

It is preferable that the breakage ratio $R_{BREAK}$ is small. A target value of $R_{BREAK}$ is from 0% to 5%.

It is preferable that the full width at half maximum FWHM of the rocking curve is small. A target value of FWHM is from 0° to 12°.

It is preferable that the piezoelectric constant $d_{33}$ is large. A target value of $d_{33}$ is 6.0 pC/N or greater.

Quality A described in the following Table 1 represents that four values among four values of σ, $R_{BREAK}$, FWHM, and $d_{33}$ reach the target values.

Quality B described in the following Table 1 represents that three values among the four values of σ, $R_{BREAK}$, FWHM, and $d_{33}$ reach the target values.

Quality C described in the following Table 1 represents that two values among the four values of σ, $R_{BREAK}$, FWHM, and $d_{33}$ reach the target values.

Quality D described in the following Table 1 represents that one or less value among the four values of σ, $R_{BREAK}$, FWHM, and $d_{33}$ reaches the target values.

structure, ucf: unit cell of face-centered cubic structure, uch: unit cell of hexagonal close-packed structure, ucw: unit cell of wurtzite structure.

What is claimed is:

1. A piezoelectric thin film device comprising:
a first electrode layer; and
a piezoelectric thin film that directly overlaps the first electrode layer,
wherein the first electrode layer contains a metal Me having a crystal structure,
the piezoelectric thin film contains aluminum nitride having a wurtzite structure,
the aluminum nitride contains a divalent metal element Md and a tetravalent metal element Mt,
[Al] is an amount of aluminum contained in the aluminum nitride,
[Md] is a total amount of the metal element Md contained in the aluminum nitride, and
[Mt] is a total amount of the metal element Mt contained in the aluminum nitride,
([Md]+[Mt])/([Al]+[Md]+[Mt]) is from 36 atom % to 70 atom %,
$L_{ALN}$ is a lattice length of the aluminum nitride in a direction that is approximately parallel to a surface of the first electrode layer with which the piezoelectric thin film is in contact,

TABLE 1

| | | | Piezoelectric thin film | | First electrode layer | | | | | | | | |
| | | | | | | Crystal | Crystal | | | | | | | |
| Unit | Md — | Mt — | [Md + Mt] [atom %] | $L_{ALN}$ [nm] | Me — | structure — | plane — | $L_{METAL}$ [nm] | ΔL [%] | σ [MPa] | $R_{BREAK}$ [%] | FWHM [deg.] | $d_{33}$ [pC/N] | Quality — |
|---|---|---|---|---|---|---|---|---|---|---|---|---|---|---|
| Example 1 | Ca | Ge | 60 | 0.5985 | Pd | fcc | (111) | 0.5510 | 8.6 | −1744 | 5 | 14.2 | 7.2 | C |
| Example 2 | Mg | Zr | 45 | 0.5821 | Ni | fcc | (111) | 0.5010 | 16.2 | −1628 | 3 | 11.8 | 11.7 | B |
| Example 3 | Mg | Zr | 55 | 0.5917 | Ir | fcc | (111) | 0.5439 | 8.8 | −1574 | 4 | 9.7 | 10.9 | B |
| Example 4 | Mg | Hf | 50 | 0.5863 | Cu | fcc | (111) | 0.5117 | 14.6 | −1510 | 2 | 10.4 | 13.4 | B |
| Example 5 | Mg | Hf | 70 | 0.6098 | Pt | fcc | (111) | 0.5551 | 9.9 | −1677 | 5 | 8.9 | 9.8 | B |
| Example 6 | Mg | Ti | 55 | 0.5878 | Cu | fcc | (111) | 0.5117 | 14.9 | −1503 | 2 | 11.2 | 12.6 | B |
| Example 7 | Mg | Ti | 62 | 0.5967 | Pd | fcc | (111) | 0.5510 | 8.3 | −1710 | 3 | 10.3 | 10.1 | B |
| Example 8 | Mg | Zr | 60 | 0.3439 | Zr | hcp | (001) | 0.3235 | 6.3 | −822 | 1 | 8.7 | 10.9 | A |
| Example 9 | Mg | Zr | 36 | 0.5727 | Pt | fcc | (111) | 0.5551 | 3.2 | −516 | 0 | 4.5 | 12.7 | A |
| Example 10 | Mg | Hf | 60 | 0.5865 | Hf | hcp | (001) | 0.5538 | 5.9 | −744 | 1 | 7.0 | 12.0 | A |
| Example 11 | Mg | Hf | 36 | 0.5732 | Pt | fcc | (111) | 0.5551 | 3.3 | −491 | 0 | 5.2 | 13.1 | A |
| Example 12 | Mg | Ti | 58 | 0.3439 | Zr | hcp | (001) | 0.3235 | 6.3 | −623 | 1 | 6.8 | 10.5 | A |
| Example 13 | Mg | Ti | 36 | 0.5715 | Pt | fcc | (111) | 0.5551 | 3.0 | −392 | 0 | 3.9 | 11.3 | A |
| Example 14 | Mg | Zr | 40 | 0.8935 | Mo | bcc | (110) | 0.8903 | 0.4 | −288 | 0 | 3.3 | 13.6 | A |
| Example 15 | Mg | Zr | 45 | 0.5816 | Cr | bcc | (110) | 0.5768 | 0.8 | −410 | 0 | 2.8 | 14.1 | A |
| Example 16 | Mg | Zr | 55 | 0.5909 | Ti | hcp | (001) | 0.5901 | 0.1 | −182 | 0 | 4.1 | 11.9 | A |
| Comparative Example 1 | Mg | Zr | 5 | 0.5438 | Pt | fcc | (111) | 0.5551 | −2.0 | 1102 | 15 | 11.0 | 0.0 | D |
| Comparative Example 2 | Mg | Zr | 34 | 0.5703 | Ag | fcc | (111) | 0.5778 | −1.3 | 813 | 16 | 8.9 | 5.9 | D |
| Comparative Example 3 | Mg | Hf | 10 | 0.5483 | Pt | fcc | (111) | 0.5551 | −1.2 | 799 | 10 | 10.5 | 5.1 | D |
| Comparative Example 4 | Mg | Ti | 7 | 0.5456 | Pt | fcc | (111) | 0.5551 | −1.7 | 760 | 11 | 12.7 | 3.7 | D |

INDUSTRIAL APPLICABILITY

According to the invention, a piezoelectric thin film device in which breakage of the piezoelectric thin film is suppressed is provided.

REFERENCE SIGNS LIST

1: substrate, 2: piezoelectric thin film, 2s: surface of piezoelectric thin film, 4: first electrode layer, 4s: surface of first electrode layer with which piezoelectric thin film is in contact, 8: adhesion layer, 9: crack, 10, 10a: piezoelectric thin film device, Al: aluminum, 12: second electrode layer, $L_{ALN}$: lattice length of aluminum nitride, $L_{METAL}$: lattice length of metal Me, Md: divalent metal element, Mt: tetravalent metal element, ucb: unit cell of body-centered cubic $L_{METAL}$ is a lattice length of the metal Me in a direction that is approximately parallel to the surface of the first electrode layer with which the piezoelectric thin film is in contact, and
$L_{ALN}$ is longer than $L_{METAL}$.

2. The piezoelectric thin film device according to claim 1, wherein the crystal structure of the metal Me is a face-centered cubic structure, a body-centered cubic structure, or a hexagonal close-packed structure.

3. The piezoelectric thin film device according to claim 1, wherein a (001) plane of the wurtzite structure is approximately parallel to the surface of the first electrode layer with which the piezoelectric thin film is in contact,
the crystal structure of the metal Me is a face-centered cubic structure, a (111) plane of the face-centered cubic structure is approximately parallel to the surface of the first electrode layer with which the piezoelectric thin film is in contact, $a_W$ is a minimum interval of elements in the (001) plane of the wurtzite structure, $a_F$ is a lattice constant of the face-centered cubic structure, the $L_{ALN}$ is expressed by $3^{1/2} \times a_W$, and the $L_{METAL}$ is expressed by $2^{1/2} \times a_F$.

4. The piezoelectric thin film device according to claim 1, wherein a (001) plane of the wurtzite structure is approximately parallel to the surface of the first electrode layer with which the piezoelectric thin film is in contact, the crystal structure of the metal Me is a body-centered cubic structure, a (110) plane of the body-centered cubic structure is approximately parallel to the surface of the first electrode layer with which the piezoelectric thin film is in contact, $a_W$ is a minimum interval of elements in the (001) plane of the wurtzite structure, $a_B$ is a lattice constant of the body-centered cubic structure, and the $L_{ALN}$ is expressed by $7^{1/2} \times a_W$, and the $L_{METAL}$ is expressed by $2 \times 2^{1/2} \times a_B$, or the $L_{ALN}$ is expressed by $3^{1/2} \times a_W$, and the $L_{METAL}$ is expressed by $2 \times a_B$.

5. The piezoelectric thin film device according to claim 1, wherein a (001) plane of the wurtzite structure is approximately parallel to the surface of the first electrode layer with which the piezoelectric thin film is in contact, the crystal structure of the metal Me is a hexagonal close-packed structure, a (001) plane of the hexagonal close-packed structure is approximately parallel to the surface of the first electrode layer with which the piezoelectric thin film is in contact, $a_W$ is a minimum interval of elements in the (001) plane of the wurtzite structure, $a_H$ is a minimum interval of the metal Me in the (001) plane of the hexagonal close-packed structure, and the $L_{ALN}$ is equal to $a_W$, and the $L_{METAL}$ is equal to $a_H$, or the $L_{ALN}$ is expressed by $3^{1/2} \times a_W$, and the $L_{METAL}$ is expressed by $2 \times a_H$.

6. The piezoelectric thin film device according to claim 1, wherein the aluminum nitride contains at least magnesium as the metal element Md, and the aluminum nitride contains at least one kind of element selected from the group consisting of zirconium, hafnium, and titanium as the metal element Mt.

7. The piezoelectric thin film device according to claim 1, wherein the degree of lattice mismatching ΔL is defined as $(L_{ALN} - L_{METAL})/L_{METAL}$, and the degree of lattice mismatching ΔL is greater than 0% and equal to or less than 8%.

8. The piezoelectric thin film device according to claim 1, wherein a compressive stress occurs in the piezoelectric thin film, the compressive stress is approximately parallel to the surface of the first electrode layer with which the piezoelectric thin film is in contact, and the compressive stress is greater than 0 MPa and equal to or less than 1500 MPa.

9. The piezoelectric thin film device according to claim 1, further comprising:

a second electrode layer that overlaps the piezoelectric thin film, wherein the piezoelectric thin film is located between the first electrode layer and the second electrode layer.

* * * * *